(12) United States Patent
Wakuda

(10) Patent No.: US 10,115,541 B2
(45) Date of Patent: Oct. 30, 2018

(54) SWITCH COMPONENT, PUSH SWITCH, ELECTRONIC DEVICE INCLUDING PUSH SWITCH

(71) Applicants: CITIZEN ELECTRONICS CO., LTD., Yamanashi-ken (JP); CITIZEN WATCH CO., LTD., Tokyo (JP)

(72) Inventor: Ryo Wakuda, Yamanashi-ken (JP)

(73) Assignees: CITIZEN ELECTRONICS CO., LTD., Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 13 days.

(21) Appl. No.: 15/592,480

(22) Filed: May 11, 2017

(65) Prior Publication Data

US 2017/0330708 A1 Nov. 16, 2017
US 2018/0151312 A9 May 31, 2018

(30) Foreign Application Priority Data

May 13, 2016 (JP) .................. 2016-097466

(51) Int. Cl.
*H01H 1/00* (2006.01)
*H01H 9/00* (2006.01)
*H01H 13/14* (2006.01)
*H01H 13/04* (2006.01)
*H01H 13/52* (2006.01)
*H05K 1/11* (2006.01)
*H05K 1/18* (2006.01)

(52) U.S. Cl.
CPC ............ *H01H 13/14* (2013.01); *H01H 13/04* (2013.01); *H01H 13/52* (2013.01); *H05K 1/111* (2013.01); *H05K 1/181* (2013.01);
*H01H 2013/525* (2013.01); *H05K 2201/094* (2013.01); *H05K 2201/0939* (2013.01); *H05K 2201/10053* (2013.01)

(58) Field of Classification Search
CPC ........ H01H 13/04; H01H 13/14; H01H 13/52; H01H 2013/525; H01H 1/00; H01H 1/02; H01H 1/06; H01H 13/50; H01H 13/78; H01H 13/785; H01H 13/79; H01H 2001/00; H01H 2001/02; H01H 2001/021; H01H 2001/247; H01H 2001/265; H01H 2001/50; H01H 2003/12; H05K 2201/10053; H05K 1/111; H05K 1/181
USPC .......................................... 200/238
See application file for complete search history.

(56) References Cited

U.S. PATENT DOCUMENTS 7,151,236 B2 * 12/2006 Ducruet ................ H01H 13/48
200/406

FOREIGN PATENT DOCUMENTS

| JP | 58-19430 | 2/1983 |
| JP | 60-5475 | 2/1985 |
| JP | 2002-298690 | 10/2002 |

* cited by examiner

*Primary Examiner* — Anthony R. Jimenez
(74) *Attorney, Agent, or Firm* — Wenderoth, Lind & Ponack, L.L.P.

(57) ABSTRACT

A switch component includes a spring plate and a cover of rubber. The cover of rubber covers at least one part of an upper surface of the spring plate. The cover of rubber includes at least one pair of supporting portions that support the spring plate.

16 Claims, 31 Drawing Sheets

SWITCH COMPONENT, PUSH SWITCH, ELECTRONIC DEVICE INCLUDING PUSH SWITCH

CROSS-REFERENCE TO RELATED APPLICATIONS

The present application claims priority under 35 U.S.C. § 119 to Japanese Patent Application No. JP2016-097466, filed May 13, 2016. The contents of this application are incorporated herein by reference in their entirety.

BACKGROUND

Field of the Invention

The present invention relates to a switch component, a push switch, and an electronic device.

Discussion of the Background

Japanese Unexamined Utility Model Application Publication No. 58-19430 discloses a push switch that includes a fixed contact and a rubber cover. The fixed contact is embedded in a substrate of the push switch. The rubber cover includes a conductive rubber contact covering the fixed contact. The substrate includes an inner peripheral wall and an outer peripheral wall. The inner peripheral wall surrounds the fixed contact. The outer peripheral wall is higher than the inner peripheral wall. The peripheral edge of a ring-shaped rubber cover is fitted into between the inner peripheral wall and the outer peripheral wall of the substrate, and is pressed down by a ring-shaped spring.

Japanese Unexamined Utility-Model Application Publication No. 60-5475 discloses a push switch that includes a switch case, a circular spring, and a ring-shaped elastic body. The switch case includes a circular depression, on which the circular spring is arranged. The circular spring includes the elastic body wrapping the circular spring on a peripheral edge of the circular spring.

Japanese Unexamined Patent Application Publication No. 2002-298690 discloses a cover member for a push switch that includes a key top component, a resin sheet, and a doom-shaped disc spring. The resin sheet includes a first surface and a second surface. The first surface is opposite to the key top component. The second surface is positioned on the opposite side of the first surface. The doom-shaped plate spring adheres to the second surface side of the resin sheet via an adhesive layer.

According to one aspect of the present invention, a switch component includes a spring plate and a cover of rubber. The cover of rubber covers at least one part of an upper surface of the spring plate. The cover of rubber includes at least one pair of supporting portions that support the spring plate.

According to another aspect of the present invention, a switch component includes a metallic spring plate and a cover of rubber. The metallic spring plate includes an outer peripheral edge and at least one pair of protrusions protruding from the outer peripheral edge. The cover of rubber covers at least a part of an upper surface of the metallic spring plate and at least one pair of protrusions protruding from the outer peripheral edge of the metallic spring plate. The cover of rubber includes a supporting portion that supports the at least one pair of protrusions of the metallic spring plate. The supporting portion of the cover of rubber includes a groove and/or a step supporting the at least one pair of protrusions protruding from the outer peripheral edge of the metallic spring plate.

According to another aspect of the present invention, a push switch includes the above-described switch component, a first contact, and a second contact. The second contact is positioned around the first contact. The metallic spring plate of the switch component is arranged on the second contact over the first contact.

According to another aspect of the present invention, a push switch includes a first contact, a second contact, a metallic spring plate, and a cover of rubber. The second contact is positioned around the first contact. The metallic spring plate includes a central portion, an outer peripheral edge, and at least one pair of protrusions protruding from the outer peripheral edge of the metallic spring plate. The outer peripheral edge of the metallic spring plate is arranged on the second contact and the central portion of the metallic spring plate is positioned over the first contact. The cover of rubber covers at least one part of an upper surface of the metallic spring plate and the at least one pair of protrusions protruding from the outer peripheral edge of the metallic spring plate.

According to another aspect of the present invention, an electronic device includes a motherboard and the above-described switch component. The motherboard includes a first electrode as a first contact and a second electrode as a second contact. The switch component is electrically arranged on the motherboard. The outer peripheral edge of the metallic spring plate of the switch component is arranged on the second contact of the motherboard.

According to the other aspect of the present invention, an electronic device includes a motherboard and the above-described push switch. The motherboard includes a first electrode and a second electrode. The push switch is electrically arranged on the motherboard and the outer peripheral edge of the metallic spring plate is arranged on the second electrode of the motherboard.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein:

FIG. 8A is an exploded perspective view of a push switch in accordance with a fifth embodiment of the present on;

DESCRIPTION OF THE EMBODIMENTS

Figure 1A:
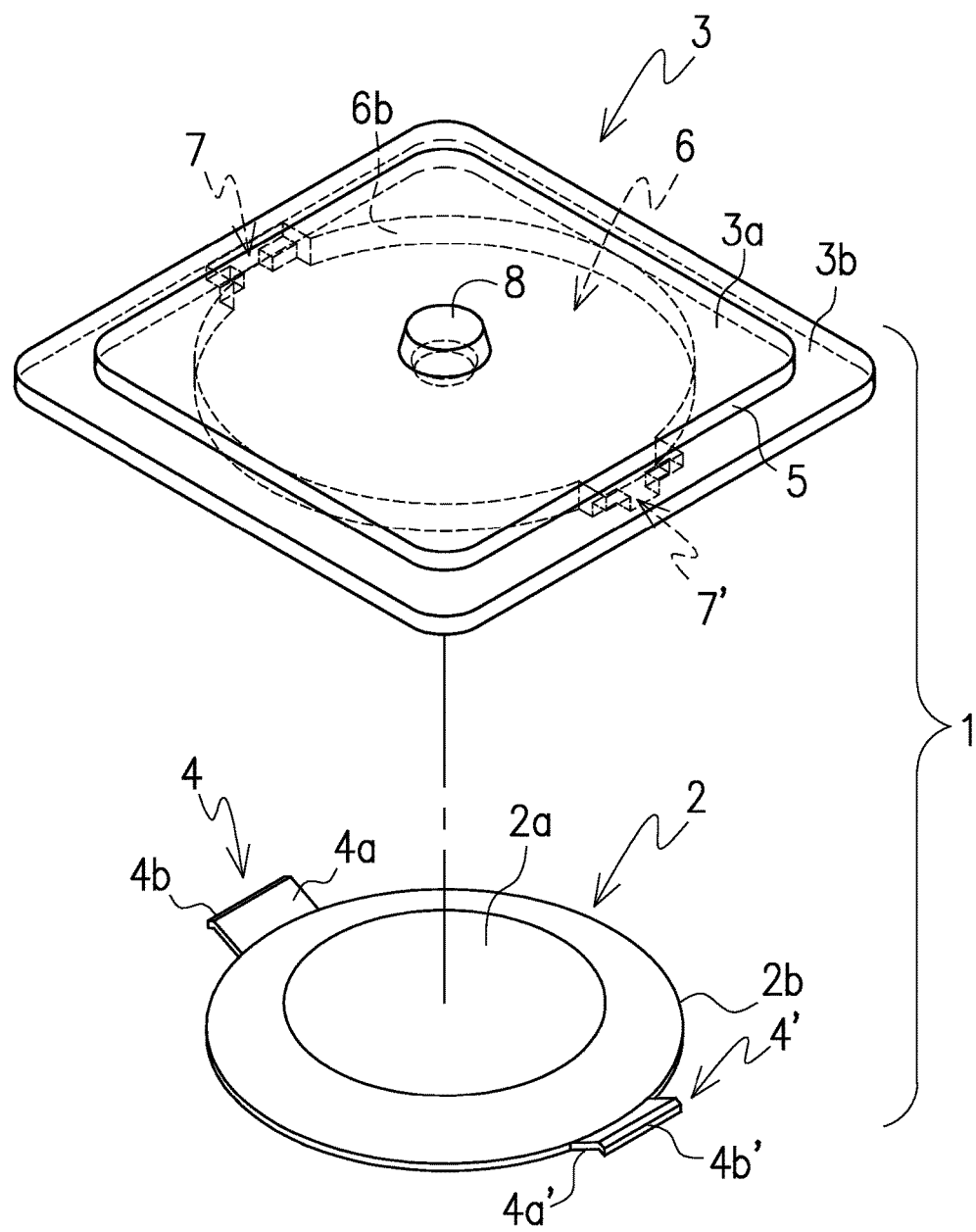
FIG. 1A is an exploded perspective view in which a switch component in accordance with a first embodiment of the present invention is viewed from above.

The embodiments will now be described with reference to the accompanying drawings, wherein like reference numerals designate corresponding or identical elements throughout the various drawings.

FIG. 1A through FIG. 1D illustrate a switch component in accordance with a first embodiment of the present invention. FIG. 1A is an exploded perspective view in which the switch component in accordance with the first embodiment of the present invention is viewed from above. A switch component 1 of the first embodiment includes a cover of rubber 3 and a metallic spring plate 2. The cover of rubber 3 covers at least one part of an upper surface 2a of the metallic spring plate 2, and at least one part of an outer peripheral edge 2b of the metallic spring plate 2. The above configuration eliminates or minimizes the vibration sound generated between a component on which a first contact and a second contact are arranged and the metallic spring plate 2, when the push switch is pushed. The component on which the first contact and the second contact of the push switch are arranged is, for example, the substrate, the resin body at least one part of which is covered with the insulating material, and the motherboard of the electronic device. The switch component according to the embodiment of the present invention is able to constitute one part of the push switch. The switch component according to the embodiment of the present invention is also applicable to various manufacturing methods of the electronic device. The push switch according to the embodiment of the present invention can be mounted electrically on the motherboard of the electronic device.

The metallic spring plate 2 of the push switch is arranged on the second contact over the first contact. Accordingly, the metallic spring plate 2 has a doom shape. The metallic spring plate 2 may be the circular sheet metal formed in a doom shape. The metallic spring plate 2 involves elasticity invertible at the time of pressing. In this embodiment, the metallic spring plate 2 is formed in a circular doom shape, but it does not always need to be circular. It may be an elliptical doom shape, or may be a quadrate doom shape. An external form of the metallic spring plate 2 may be a doom shape that is a combination of an arc and a straight line. The outer peripheral edge 2b of the metallic spring plate 2 according to this embodiment includes one pair of protrusions protruding from the outer peripheral edge 2b. The outer peripheral edge 2b of the metallic spring plate 2 according to this embodiment includes a first protrusion 4 and a second protrusion 4'. The first protrusion 4 protrudes from the outer peripheral edge 2b of the metallic spring plate 2. The second protrusion 4' is on the opposite side of the first protrusion 4. The first protrusion 4 and the second protrusion 4' are arranged on the outer peripheral edge 2b of the metallic spring plate 2 at even intervals. The first protrusion 4 includes a rectangular sloping portion 4a of the protrusion, and a hook 4b at the outer end of the sloping portion. The sloping portion 4a extends diagonally upward from the outer peripheral edge 2b of the metallic spring plate 2. The hook 4b bends outwardly from the end of the sloping portion 4a of the protrusion. The second protrusion 4' includes a rectangular sloping portion 4a' of the protrusion, and a hook 4b' at the outer end of the sloping portion. The sloping portion 4a' extends diagonally upward from the outer peripheral edge 2b of the metallic spring plate 2. The hook 4b' bends outwardly from the end of the sloping portion 4a' of the protrusion.

Figure 1B:
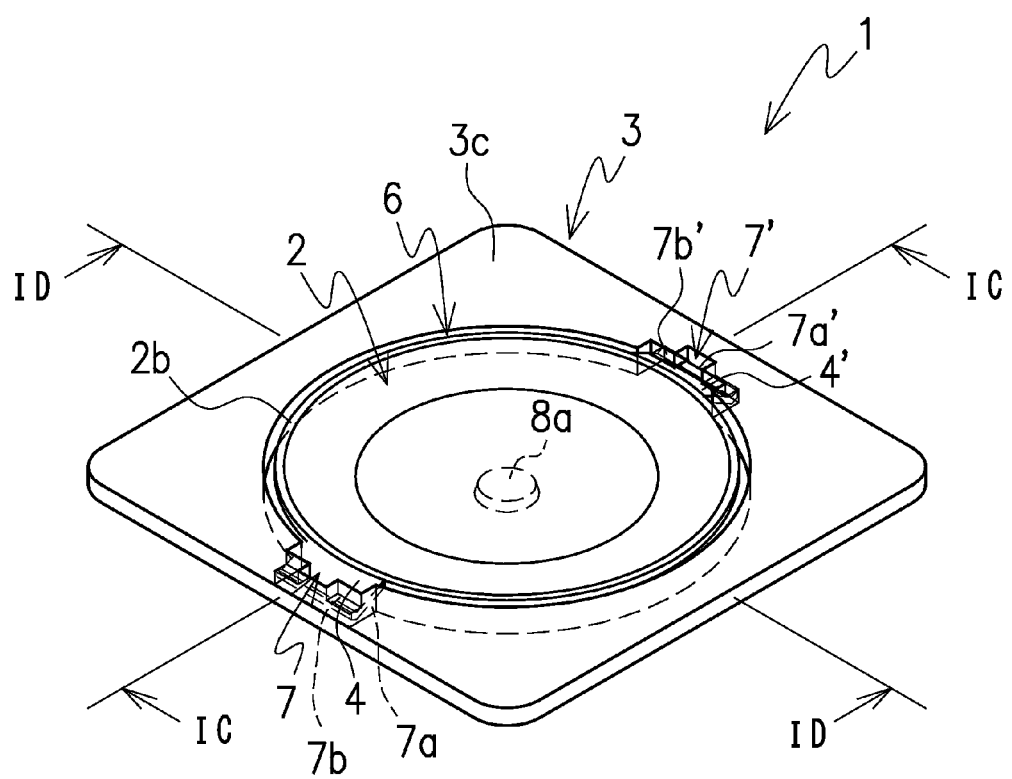
FIG. 1B is a downward perspective view of the switch component illustrated in FIG. 1A.
Figure 1C:
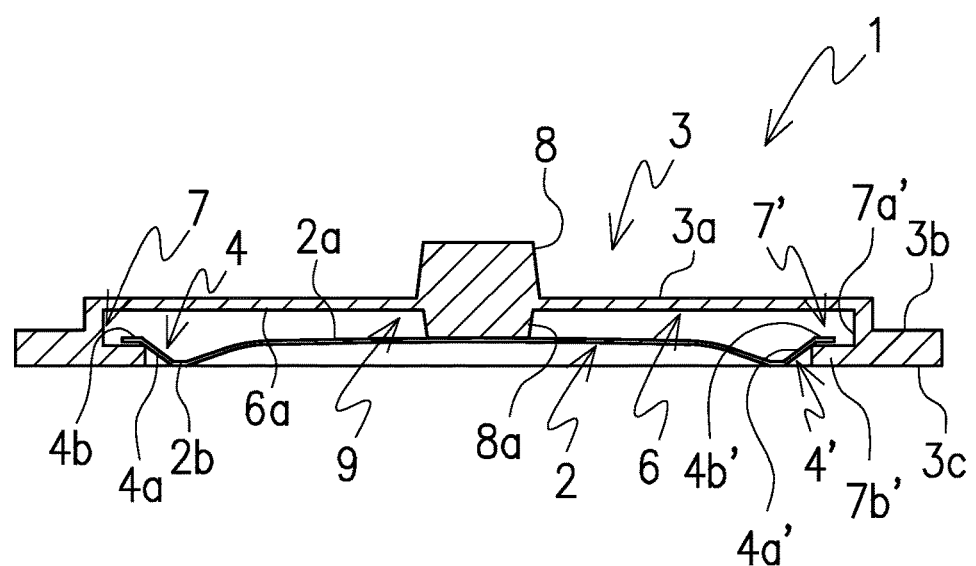
FIG. 1C is a sectional view taken along line IC-IC of the switch component illustrated in FIG. 1B.
Figure 1D:
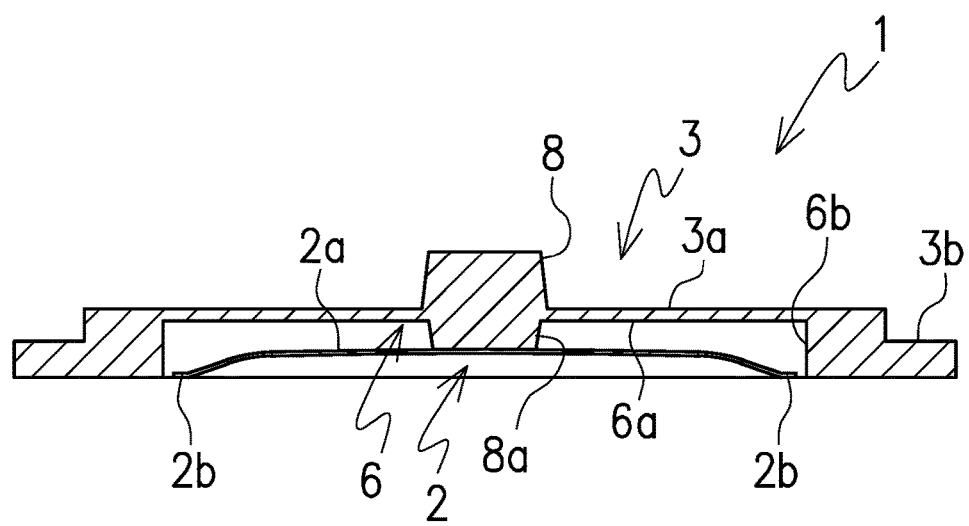
FIG. 1D is a sectional view taken along line ID-ID of the switch component illustrated in FIG. 1B.

FIG. 1B is a downward perspective view of the switch component illustrated in FIG. 1A. FIG. 1C is a sectional view taken along line IC-IC of the cover of rubber 3 and the metallic spring plate 2, which are the switch component illustrated in FIG. 1B. A supporting portion 7 of the cover of rubber 3 supports the first protrusion 4 of the metallic spring plate 2. A second supporting portion 7' of the cover of rubber 3 supports the second protrusion 4' of the metallic spring plate 2. FIG. 1D is a sectional view taken along line ID-ID of the switch component illustrated in FIG. 1B. The cover of rubber 3 has a hollow portion 6 on the lower surface of the cover of rubber 3. The cover of rubber 3 may also have a second protruding portion 8a in the center of the hollow portion 6. The second protruding portion 8a abuts above the center of the upper surface 2a of the metallic spring plate 2. The hollow portion 6 on the lower surface of the cover of rubber 3 covers the upper surface 2a of the metallic spring plate 2. In this embodiment, the second protruding portion 8a protrudes toward the center of the upper surface 2a of the metallic spring plate 2. The second protruding portion 8a may also be made of the same material with the cover of rubber 3. The first supporting portion 7 of the cover of rubber 3 abuts on a peripheral edge 6b of the hollow surface of the hollow portion 6, which is on the lower surface of the cover of rubber 3. In this embodiment, the first supporting portion 7 is formed with a groove 7a and a step 7b. The groove 7a is dented at the peripheral edge 6b of the hollow surface of the hollow portion 6. The step 7b protrudes into the groove 7a. The second support portion 7' of the cover of rubber 3 is positioned on the opposite side of the first supporting portion 7, and abuts on the peripheral edge 6b of the hollow surface of the hollow portion 6, which is on the lower surface of the cover of rubber 3. In this embodiment, the second supporting portion 7' is formed with a groove 7a' and a step 7b'. The groove 7a' is dented at the peripheral edge 6b of the hollow surface of the hollow portion 6. The step 7b' protrudes into the groove 7a'. The configuration disclosed in this embodiment facilitates the positioning of the cover of rubber 3 and the metallic spring plate 2.

The cover of rubber 3 in this embodiment includes, as illustrated in FIG. 1C, a central portion 3a and an outer peripheral portion 3b. The central portion 3a has the hollow portion 6 on the lower surface. The outer peripheral portion 3b surrounds the central portion 3a. Since the central portion 3a includes the hollow portion 6 on the lower surface, as illustrated in FIG. 1A, the upper surface of the central portion 3a is higher than the upper surface of the outer peripheral portion 3b. The cover of rubber 3 includes a raised portion 5 between the upper surface of the central portion 3a and the upper surface of the outer peripheral portion 3b. The cover of rubber 3 includes the supporting portions at positions where the central portion 3a and the outer peripheral portion 3b overlap seeing from above. In this embodiment, as described above, the cover of rubber 3 includes the first supporting portion 7 and the second supporting portion 7'. Each supporting portion abuts on the hollow surface 6a of the hollow portion of the central portion 3a, and is a gap formed horizontally into the outer peripheral portion 3b. The doom-shaped metallic spring plate 2 is housed in the hollow portion 6 of the cover of rubber 3. Seeing from above, the support portions inside of the cover of rubber supports the protrusions, which protrude outwardly from the outer peripheral edge of the metallic spring plate. With the cover illustrated in the embodiment of the present invention of rubber, it is possible to expect to have the effect of absorbing the sound and the vibration generated at the time of inverting the metallic spring plate.

A first protruding portion 8 is formed in the center of the upper surface of the central portion 3a. The first protruding portion 8 on the upper surface and the second protruding portion 8a on the lower surface are positioned on the central axis of the push switch. When the first protruding portion 8 is pressed, the lower end of the second protruding portion 8a presses the upper surface 2a of the metallic spring plate 2. From the above, the metallic spring plate 2 inverts. There is a gap 9 between the upper surface 2a of the metallic spring plate 2 and the hollow surface 6a of the hollow portion 6.

Figure 1E:
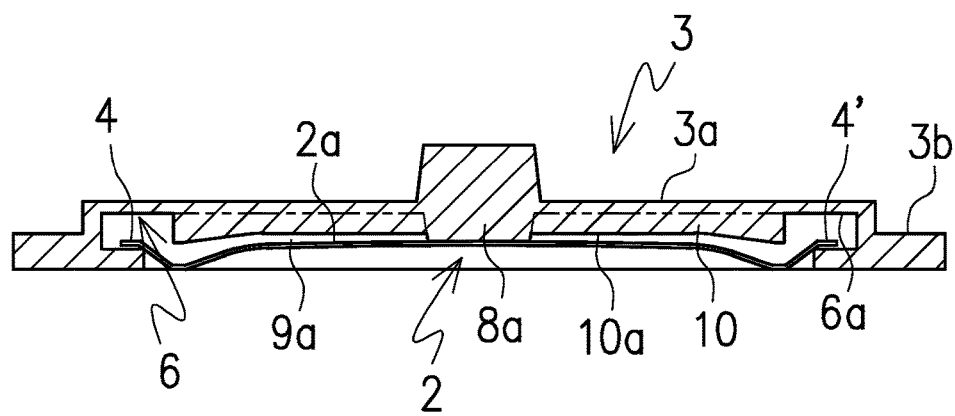
FIG. 1E is another sectional view taken along line IC-IC of the switch component illustrated in FIG. 1B, and is a sectional view showing a modification of the cover of rubber.

FIG. 1E is another sectional view taken along line IC-IC of the switch component illustrated in FIG. 1B, and is a sectional view indicating a modification of the cover of rubber. The cover of rubber 3 in this embodiment includes a thickening portion 10. The thickening portion 10 is between the circumference of the second protruding portion 8a and the lower surface peripheral edge portion of the cover of rubber 3. The second protruding portion 8a is positioned in the center of the hollow portion 6 on the lower surface. The thickening portion 10 becomes thicker toward a position of the peripheral edge portion of the cover of rubber 3. The thickening portion 10 is thinner than the protruding portion 8a, which is in the center of the cover of rubber 3. The thickening portion 10 is thicker than a thick portion of the hollow portion 6 of the cover of rubber 3. The thick portion is formed in the outside of the thickening portion 10, and is opposite to the protruding portion of the spring. In this modification, the thickening portion 10 is formed on the hollow surface 6a of the hollow portion 6 in the cover of rubber 3. It makes the width of a gap 9a narrow. The gap 9a is defined by the thickening portion 10 and the upper surface 2a of the metallic spring plate 2. This configuration enables it to eliminate or minimize the inverting sound of the metallic spring plate 2 by forming the narrow gap 9a uniformly along the upper surface 2a of the metallic spring plate 2.

Figure 2A:
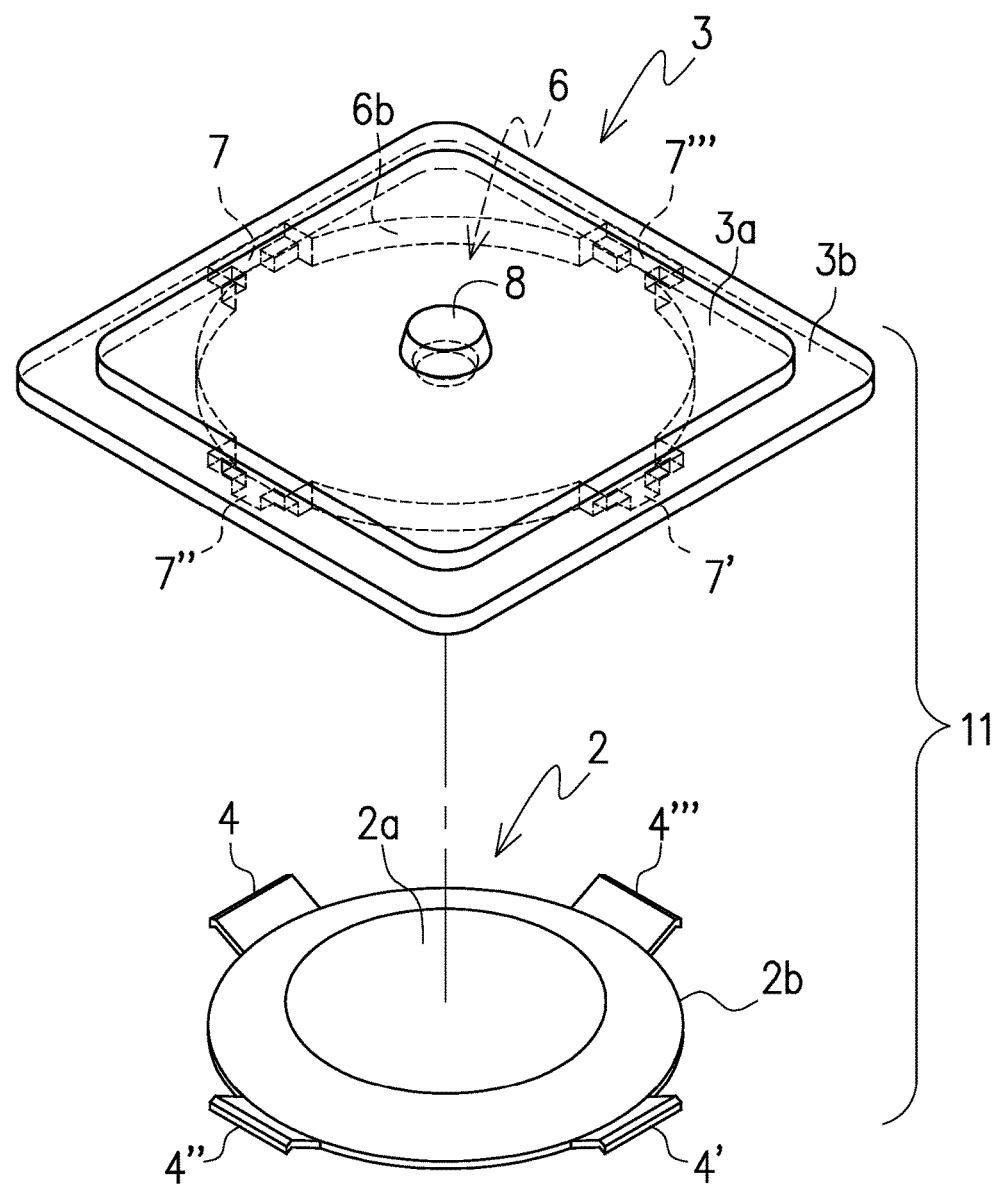
FIG. 2A is an exploded perspective view in which a switch component in accordance with a second embodiment of the present invention is viewed from above.

FIG. 2A is an exploded perspective view in which a switch component in accordance with a second embodiment of the present invention is viewed from above. The switch component 11 of the second embodiment includes the cover of rubber 3 and the metallic spring plate 2. The metallic spring plate 2 is arranged on the second contact over the first contact as the component that constitutes the push switch. The metallic spring plate 2 has a doom shape. On the outer peripheral of the metallic spring plate 2, there are the first protrusion 4, the second protrusion 4', a third protrusion 4", and a fourth protrusion 4''', all of which protrude outwardly from the outer peripheral edge 2b. The second protrusion 4' is on the opposite side of the first protrusion 4. The fourth protrusion 4''' is on the opposite side of the third protrusion 4". The first protrusion 4, the second protrusion 4', the third protrusion 4", and the fourth protrusion 4''' are on the outer peripheral edge 2b of the metallic spring plate 2 at even intervals. Although it is not illustrated, as another embodiment, the outer peripheral edge of the metallic spring plate 2 may be the configuration having three protrusions, which are the first protrusion, the second protrusion and the third protrusion. Each protrusion is on the outer peripheral edge 2b of the metallic spring plate 2 at even intervals.

Figure 2B:
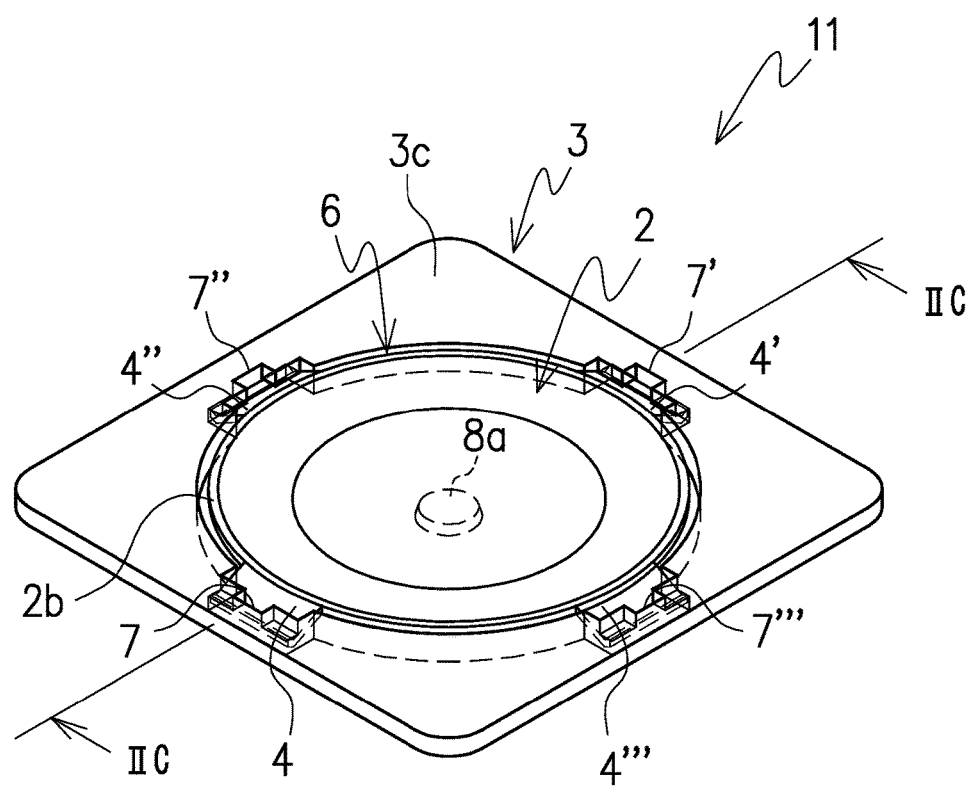
FIG. 2B is a downward perspective view of the switch component illustrated in FIG. 2A.
Figure 2C:
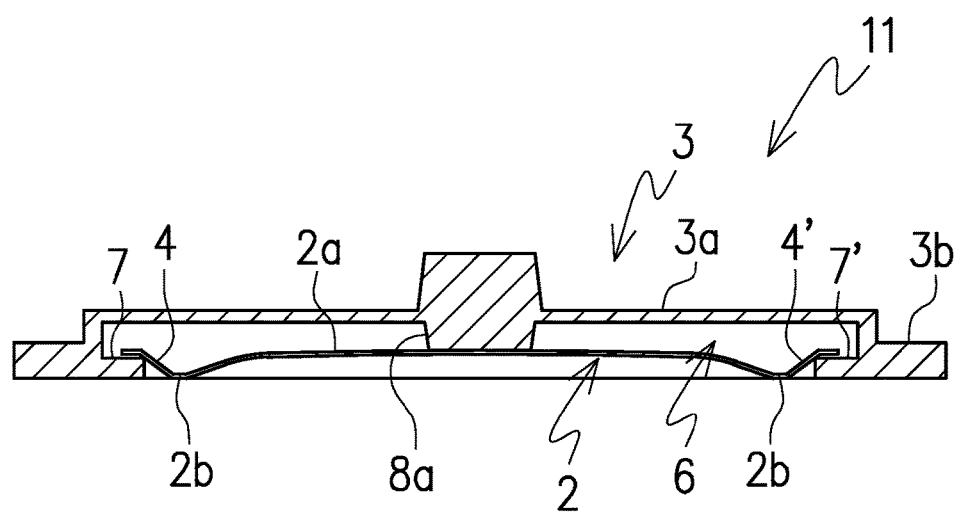
FIG. 2C is a sectional view taken along line IIC-IIC of the switch component illustrated in FIG. 2B.

FIG. 2B is a downward perspective view of the switch component illustrated in FIG. 2A. FIG. 2C is a sectional view taken along line IIC-IIC of the switch component illustrated in FIG. 2B. The first supporting portion 7 of the cover of rubber 3 supports the first protrusion 4 of the metallic spring plate 2. The second supporting portion T of the cover of rubber 3 supports the second protrusion 4' of the metallic spring plate 2. The third supporting portion 7" of the cover of rubber 3 supports the third protrusion 4" of the metallic spring plate 2. The fourth supporting portion 7''' of the cover of rubber 3 supports the fourth protrusion 4''' of the metallic spring plate 2. The cover of rubber 3 has the hollow portion 6 on the lower surface. The cover of rubber 3 may also have the second protruding portion 8a in the center of the hollow portion 6. The second protruding portion 8a abuts above the center of the upper surface 2a of the metallic spring plate 2. The hollow portion 6 on the lower surface of the cover of rubber 3 covers the upper surface 2a of the metallic spring plate 2. In this embodiment, the second protruding portion 8a protrudes toward the center of the upper surface 2a of the metallic spring plate 2. The second protruding portion 8a may also be made of the same material with the cover of rubber 3. The first supporting portion 7 of the cover of rubber 3 abuts on the outside of the peripheral edge 6b of the hollow surface of the hollow portion 6, which is on the lower surface of the cover of rubber 3. The second supporting portion 7' is positioned on the opposite side of the first supporting portion 7. The second supporting portion 7' abuts on the outside of the peripheral edge 6b of the hollow surface of the hollow portion 6, which is on the lower surface of the cover of rubber 3. The third supporting portion 7" of the cover of rubber 3 abuts on the outside of the peripheral edge 6b of the hollow surface of the hollow portion 6, which is on the lower surface of the cover of rubber 3. The fourth supporting portion 7''' is positioned on the opposite side of the third supporting portion 7". The fourth supporting portion 7''' abuts on the outside of the peripheral edge 6b of the hollow surface of the hollow portion 6, which is on the lower surface of the cover of rubber 3. The configuration disclosed in this embodiment further facilitates the positioning of the cover of rubber 3 and the metallic spring plate 2.

Figure 3A:
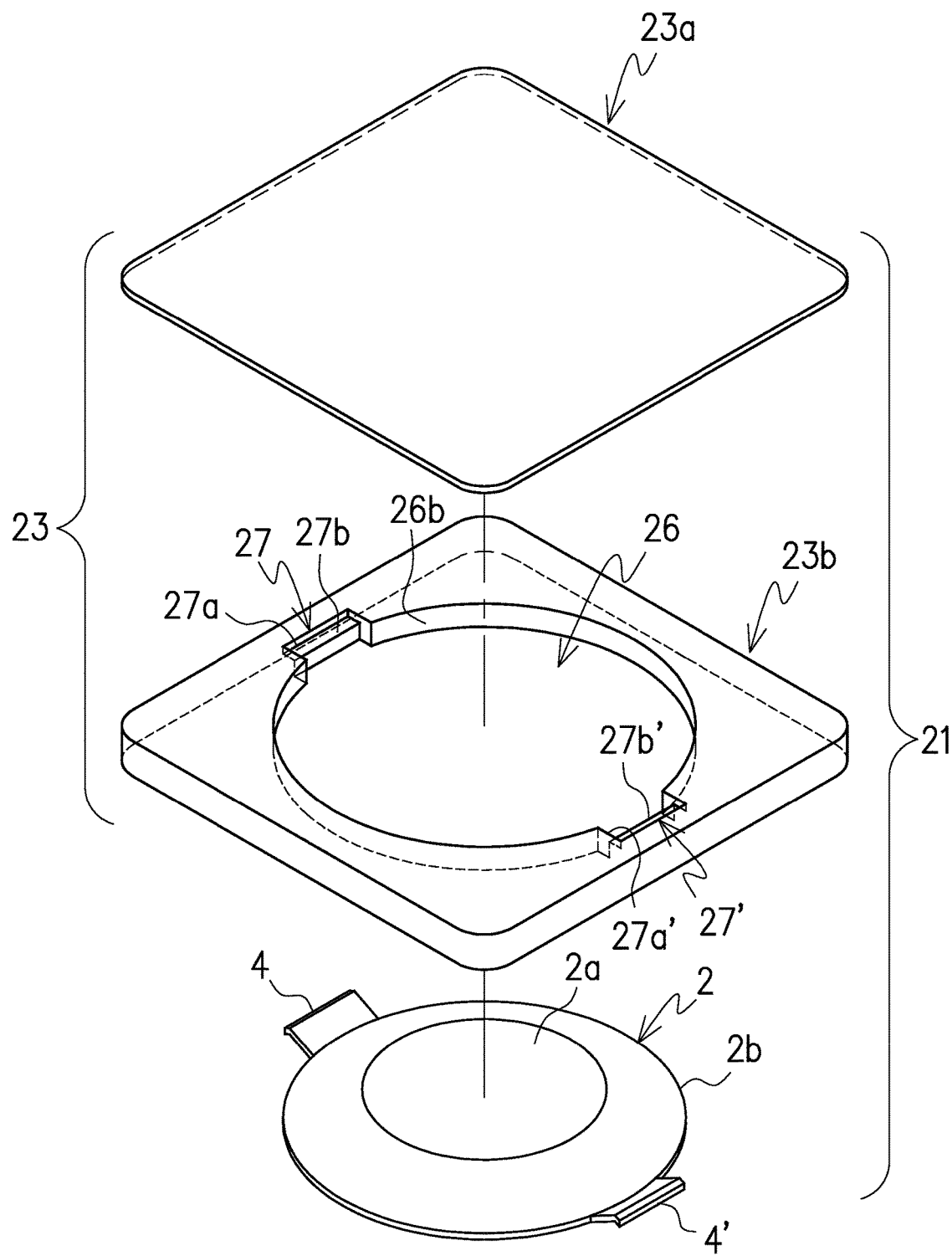
FIG. 3A is an exploded perspective view in which a switch component in accordance with a third embodiment of the present invention is viewed from above.
Figure 3B:
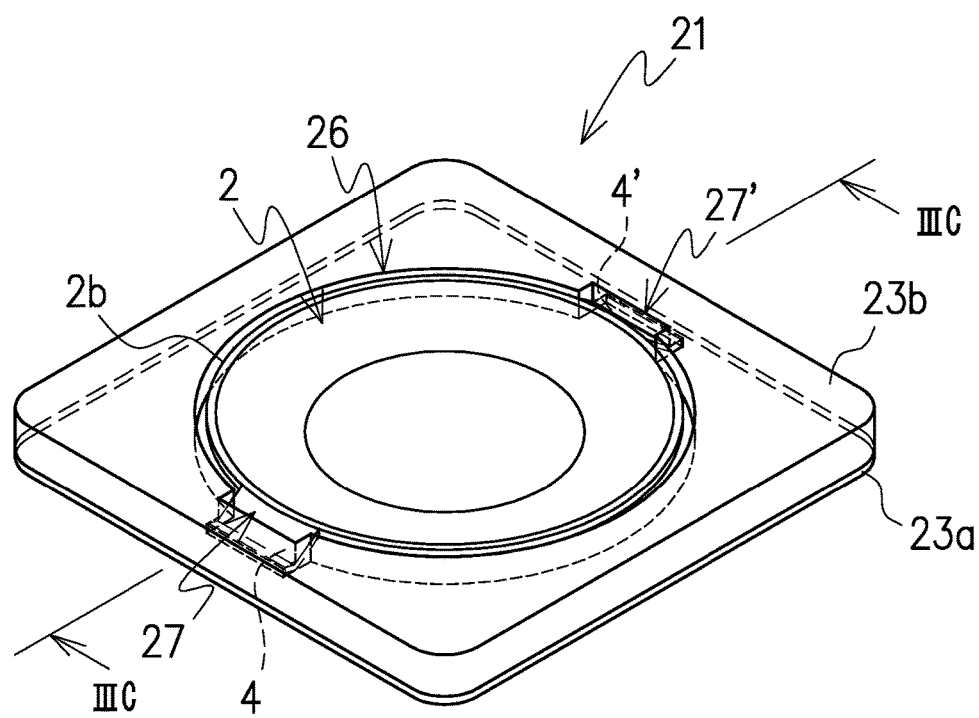
FIG. 3B is a downward perspective view of the switch component illustrated in FIG. 3A.
Figure 3C:
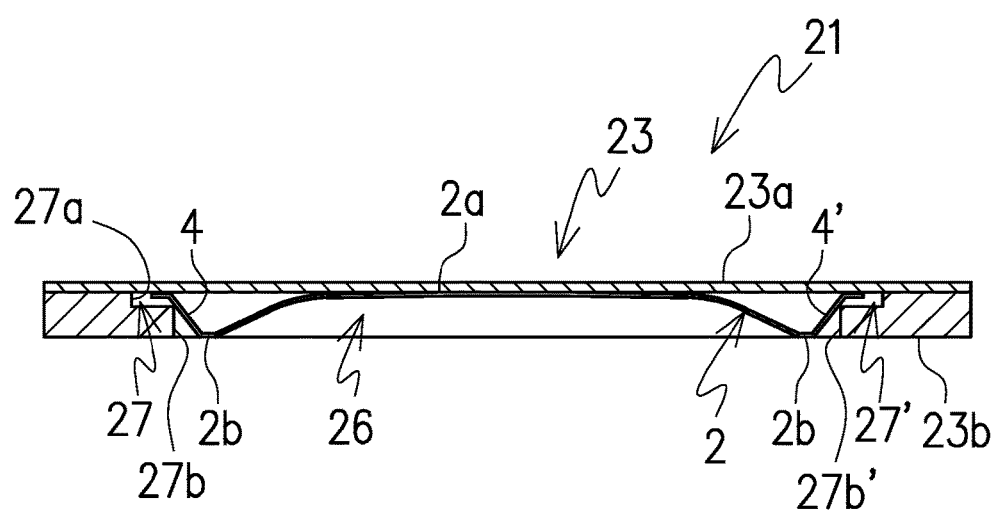
FIG. 3C is a sectional view taken along line of the switch component illustrated in FIG. 3B.

FIG. 3A is an exploded perspective view in which a switch component in accordance with a third embodiment of the present invention is viewed from above. FIG. 3B is a downward perspective view of the switch component illustrated in FIG. 3A. FIG. 3C is a sectional view taken along line IIIC-IIIC of the switch component illustrated in FIG. 3B. A switch component 21 of the third embodiment includes a cover of rubber 23, and the metallic spring plate 2. The cover of rubber 23 includes a first cover 23a and a second cover 23b. The switch component 21 includes, as with the first embodiment, the doom-shaped metallic spring plate 2, and the cover of rubber 23. The cover of rubber 23 covers the upper surface 2a and the outer peripheral edge 2b of the metallic spring plate 2. The metallic spring plate 2 includes the first protrusion 4 and the second protrusion 4'. The first protrusion 4 protrudes from a first part on the outer peripheral edge 2b. The second protrusion 4' protrudes from a second part opposite to the first part on the outer peripheral edge 2b. In the cover of rubber 23, the first cover 23a and the second cover 23b are provided separately. The first cover 23a covers the whole upper surface 2a of the metallic spring plate 2. The second cover 23b supports the first protrusion 4 and the second protrusion 4', which protrude from the outer peripheral edge 2b of the metallic spring plate 2.

The first cover 23a is on the second cover 23b. The first cover 23a and the second cover 23b are made of the rectangular rubber member. The first cover 23a is made of a thin rubber sheet. The second cover 23b is made of a rubber frame member, which has the thickness approximately identical to the height of the metallic spring plate 2. An opening 26 is formed in the central part of the second cover 23b. The opening 26 houses the metallic spring plate 2. The opening 26 exposes the upper surface 2a of the metallic spring plate 2. The opening 26 is made to be a circular through hole. The size of the hole approximately corresponds to the external dimensions of the metallic spring plate 2. The outer peripheral edge 2b of the metallic spring plate 2 fits into the opening 26 along a peripheral edge 26b of the hollow surface of the opening 26. A first supporting portion 27 is on the peripheral edge 26b of the hollow surface of the opening 26. The first supporting portion 27 supports the first protrusion 4 protruding from the outer peripheral edge 2b of the metallic spring plate 2. A second supporting portion 27' is on the opposite side of the first supporting portion 27 on the peripheral edge 26b of the hollow surface of the opening 26. The second supporting portion 27' supports the second protrusion 4'. The first supporting portion 27 includes a groove 27a and a step 27b. The groove 27a is dented at the peripheral edge 26b of the hollow surface of the opening 26. The step 27b protrudes into the groove 27a. The second supporting portion 27' includes a groove 27a' and a step 27b'. The groove 27a' is dented at the peripheral edge 26b of the hollow surface of the opening 26. The step 27b' protrudes into the groove 27a', At least one part of the outer peripheral edge 2b of the metallic spring plate 2 is on the second contact.

In this embodiment, the metallic spring plate 2 is fitted in the opening 26 of the second cover 23b. One pair of the supporting portions 27 and 27' on the peripheral edge 26b of the hollow surface of the opening 26 supports one pair of the protrusions 4 and 4', which protrude from the outer peripheral edge 2b of the metallic spring plate 2. After that, the first cover 23a is placed on the second cover 23b to seal the opening 26. From the above, the upper surface 2a of the metallic spring plate 2 is covered. Since the thickness of the second cover 23a is made to match to the size of the height of the metallic spring plate 2, the back surface of the first cover 23a directly contacts with the central part of the upper surface 2a of the metallic spring plate 2. In this way, the metallic spring plate 2 is prevented from coming off. The lower surface of the first cover 23a is fixed to the upper surface surrounding the opening 26 of the second cover 23b with the adhesive and the likes. The lower surface of the first cover 23a may adhere to the upper surface of the metallic spring plate 2.

According to the switch component 21 in this embodiment, it is possible to press the metallic spring plate 2 directly by pushing the upper surface of the first cover 23a. Since the first cover 23a does not include the protruding portion, the thickness of the switch component 21 is reduced by the thickness of the protruding portion.

Figure 4A:
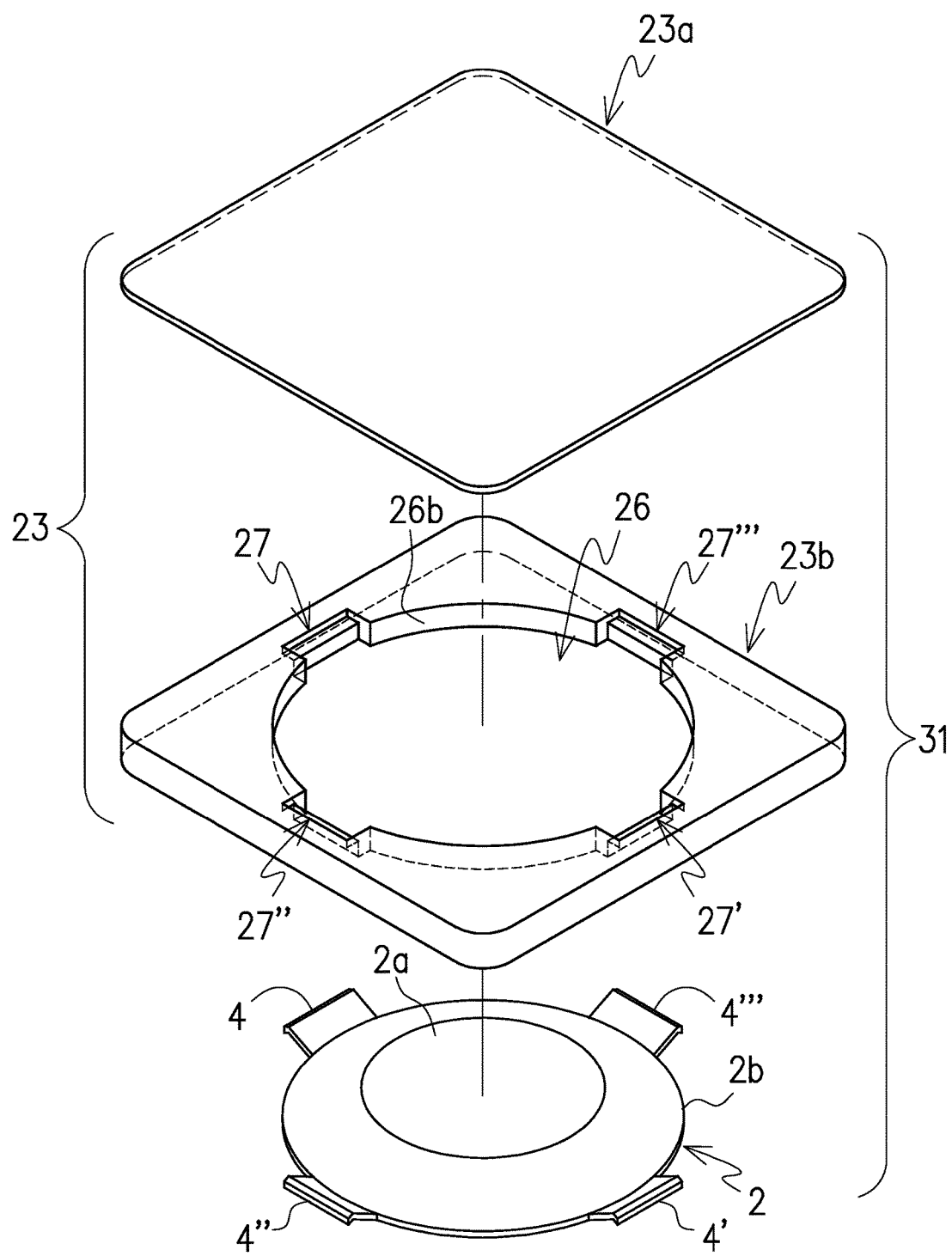
FIG. 4A is an exploded perspective view in which a switch component in accordance with a fourth embodiment of the present invention is viewed from above.
Figure 4B:
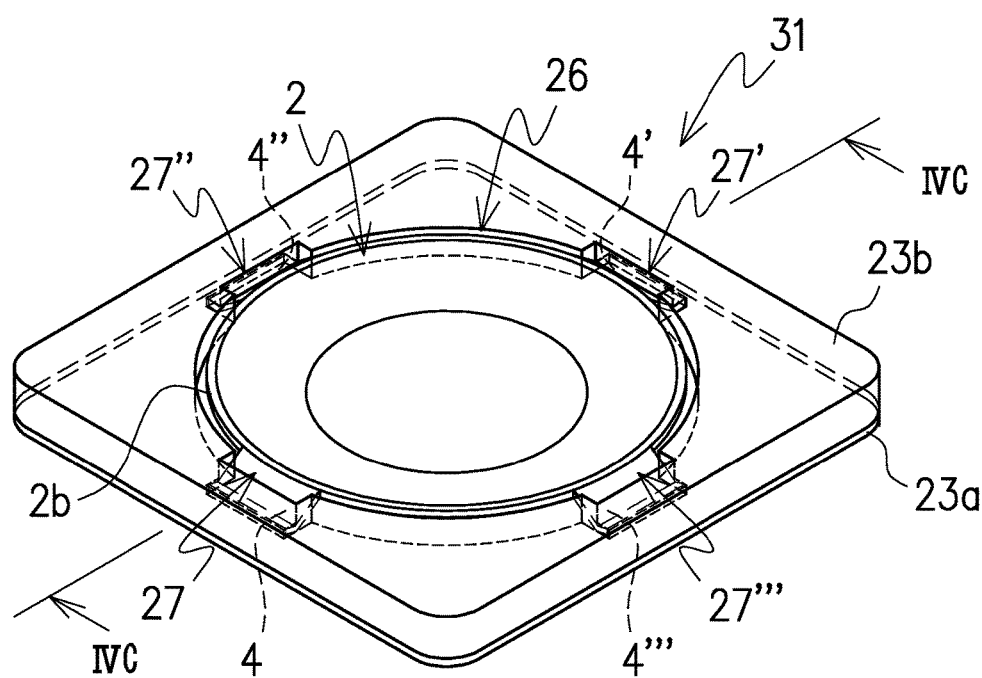
FIG. 4B is a downward perspective view of the switch component illustrated in FIG. 4A.
Figure 4C:
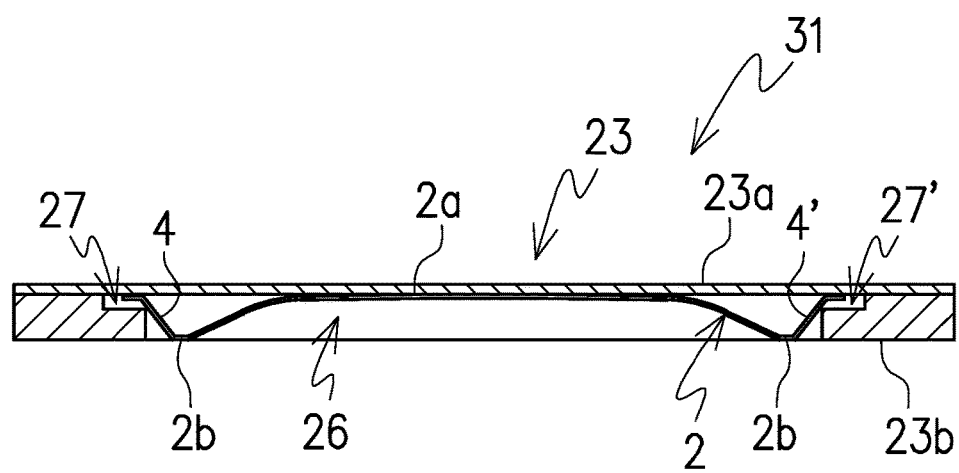
FIG. 4C is a sectional view taken along line IVC-IVC of the switch component illustrated in FIG. 4B.

FIG. 4A is an exploded perspective view in which a switch component in accordance with a fourth embodiment of the present invention is viewed from above. FIG. 4B is a downward perspective view of the switch component illustrated in FIG. 4A. FIG. 4C is a sectional view taken along line IVC-IVC of the switch component illustrated in FIG. 4B. A switch component 31 in accordance with this embodiment includes the cover of rubber 23 and the metallic spring plate 2. The cover of rubber 23 includes the first cover 23a and the second cover 23b. The metallic spring plate 2 is arranged on the second contact over the first contact as the switch component. The metallic spring plate 2 has a doom shape. On the outer peripheral of the metallic spring plate 2, there are the first protrusion 4, the second protrusion 4', the third protrusion 4", and the fourth protrusion 4'" all of which protrude outwardly from the outer peripheral edge 2b. The second protrusion 4' is on the opposite side of the first protrusion 4. The fourth protrusion 4'" is on the opposite side of the third protrusion 4". The first protrusion 4, the second protrusion 4', the third protrusion 4", and the fourth protrusion 4'" are arranged on the outer peripheral edge 2b of the metallic spring plate 2 at even intervals.

In the cover of rubber 23, the first cover 23a and the second cover 23b are provided separately. The first cover 23a covers the whole upper surface 2a of the metallic spring plate 2. The second cover 23b covers the outer peripheral edge 2b of the metallic spring plate 2. The first supporting portion 27 of the second cover of rubber 23b supports the first protrusion 4 of the metallic spring plate 2. The second supporting portion 27' of the second cover of rubber 23b supports the second protrusion 4' of the metallic spring plate 2. The third supporting portion 27" of the second cover of rubber 23b supports the third protrusion 4" of the metallic spring plate 2. The fourth supporting portion 27'" of the second cover of rubber 23b supports the fourth protrusion 4'" of the metallic spring plate 2. In the central part of the second cover 23b, the opening 26 is arranged. The opening 26 houses the metallic spring plate 2, and exposes the upper surface 2a of the metallic spring plate 2. The first supporting portion 27, the second supporting portion 27', the third supporting portion 27", and the fourth supporting portion 27'" are arranged outwardly from the peripheral edge 26b of the hollow surface of the opening 26 at even intervals.

In this embodiment, since the first protrusion 4, the second protrusion 4', the third protrusion 4", and the fourth protrusion 4'" on the outer peripheral edge 2b of the metallic spring plate 2 are supported by the supporting portions of the cover of rubber 23 with four directions, the metallic spring plate 2 is supported more surely.

Figure 5A:
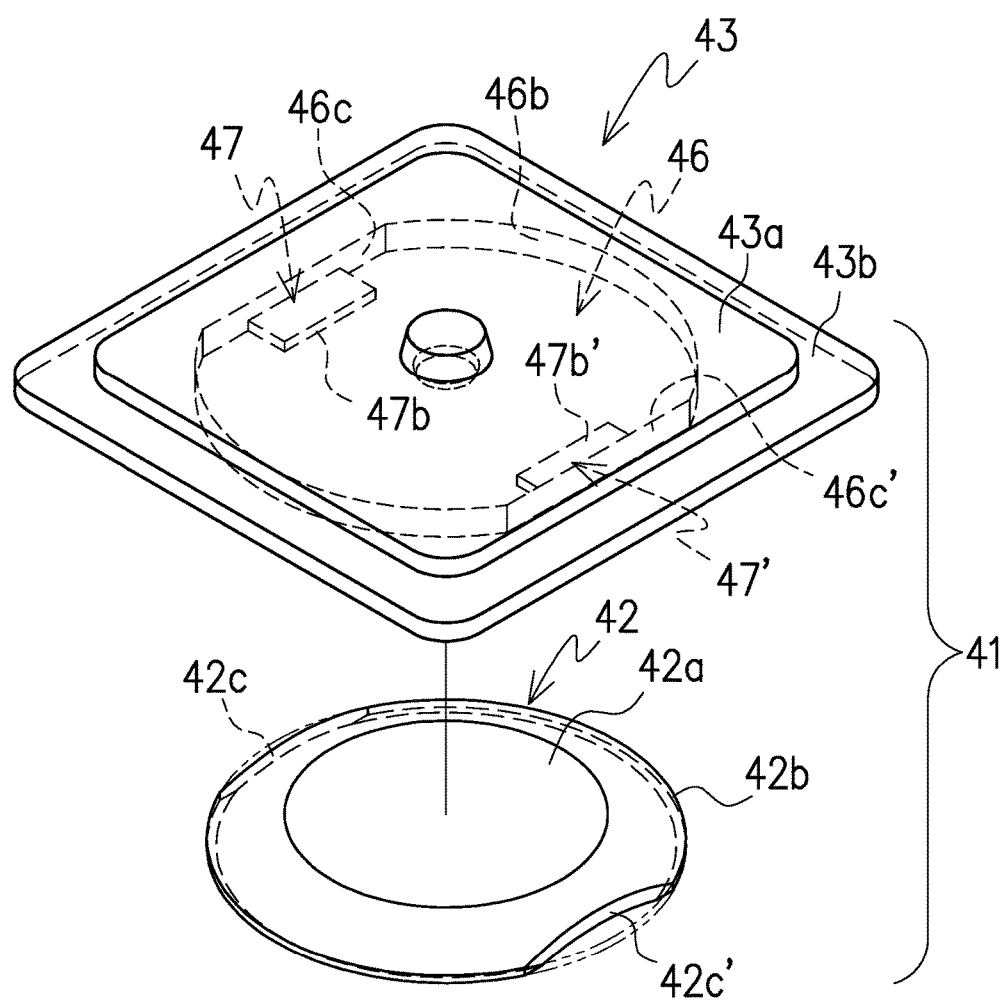
FIG. 5A is an exploded perspective view in which a switch component in accordance with a fifth embodiment of the present invention is viewed from above.
Figure 5B:
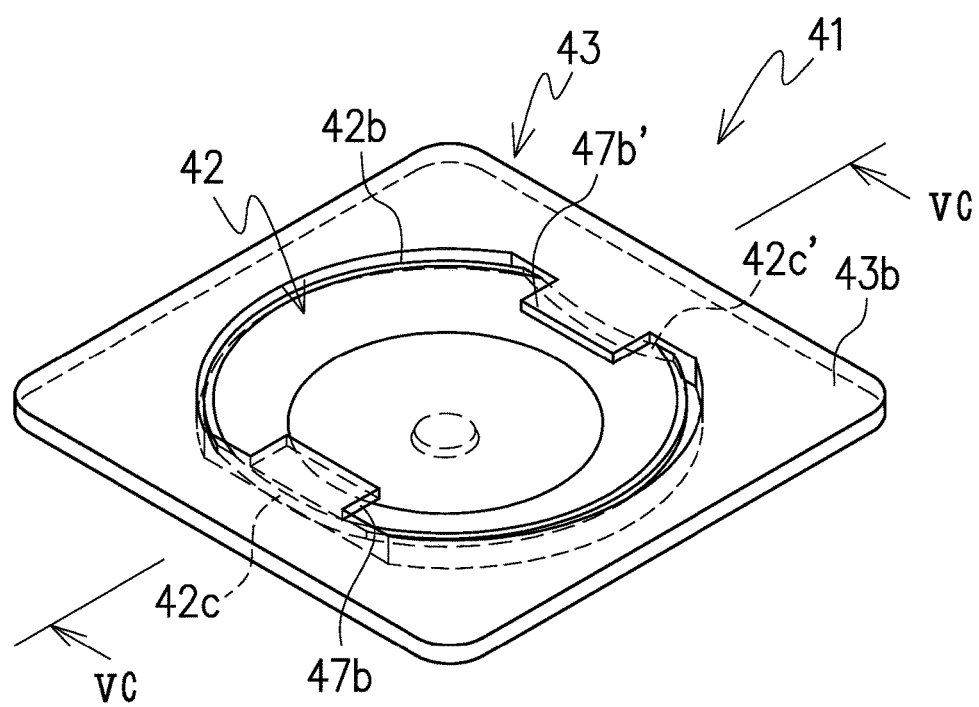
FIG. 5B is a downward perspective view of the switch component illustrated in FIG. 5A.
Figure 5C:
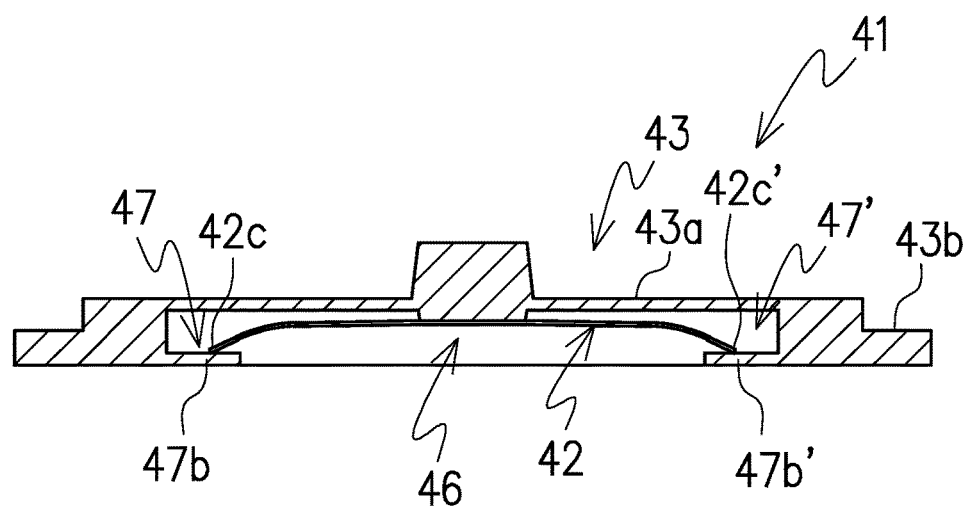
FIG. 5C is a sectional view taken along line VC-VC of the switch component illustrated in FIG. 5B.

FIG. 5A is an exploded perspective view in which a switch component in accordance with a fifth embodiment of the present invention is viewed from above. FIG. 5B is a downward perspective view of the switch component illustrated in FIG. 5A. FIG. 5C is a sectional view taken along line VC-VC of the switch component illustrated in FIG. 5B. A switch component 41 in accordance with this embodiment provides with a doom-shaped metallic spring plate 42 and a cover of rubber 43. The cover of rubber 43 covers an upper surface 42a and an outer peripheral edge 42b of the metallic spring plate 42. The metallic spring plate 42 in accordance with this embodiment has a circular arc portion and a linear portion. The metallic spring plate 42 has one pair of linear side portions on both sides. One pair of side portions consists of a first side portion 42c and a second side portion 42c' of the metallic spring plate 42. The side portion 42c is a part where one part of the outer peripheral edge 42b of the metallic spring plate 42 is formed straightly. The side portion 42c' is positioned on the opposite side of the first side portion 42c.

On the other hand, the cover of rubber 43 includes, as with the cover of rubber 3 in the first embodiment, a thick central portion 43a and a thin outer peripheral portion 43b seeing from the outside. The outer peripheral portion 43b surrounds the central portion 43a. A hollow portion 46 is on the lower surface of the central portion 43a. The shape of the hollow portion 46 corresponds to the external shape of the metallic spring plate 42. That is, the peripheral edge 46b of the hollow surface on both sides of the hollow portion 46 has a first linear portion 46c and a second linear portion 46c'. The first linear portion 46c corresponds to the first side portion 42c of the metallic spring plate 42. The second linear portion 46c' corresponds to the second side portion 42c' of the metallic spring plate 42. The first linear portion 46c includes a first supporting portion 47 supporting the first side portion 42c of the metallic spring plate 42. The second linear portion 46c' on the opposite side includes a second supporting portion 47' supporting the second side portion 42c' of the metallic spring plate 42. The first supporting portion 47 includes a rectangular step 47b. The step 47b protrudes in a horizontal direction into the hollow portion 46 from the first linear portion 46c of the peripheral edge 46b of the hollow surface. The second portion 47' includes a rectangular step 47b'. The step 47b' protrudes in a horizontal direction into the hollow portion 46 from the second linear portion 46c' of the peripheral edge 46b of the hollow surface.

Figure 6A:
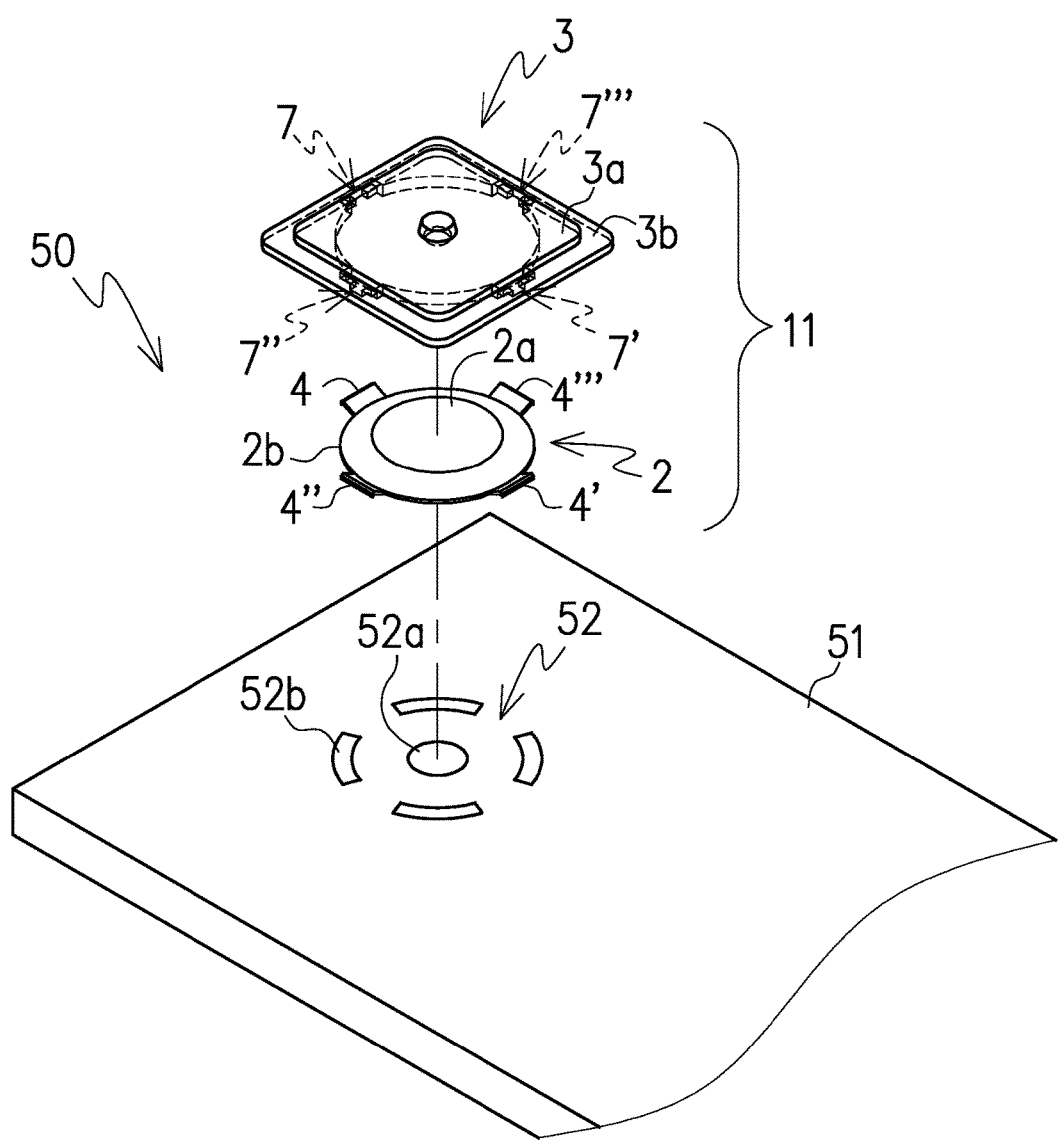
FIG. 6A is an exploded perspective view in which a push switch in accordance with a first embodiment of the present invention is viewed from above, FIG. 6A illustrating the push switch including the switch component in accordance with the second embodiment of the present invention, which includes a metallic spring plate, and a cover of rubber, the metallic spring plate being electrically connected to a first electrode as a first contact and a second electrode as a second contact, which are arranged on a motherboard of an electronic device, and the cover of rubber covering at least one part of the metallic spring plate.
Figure 6B:
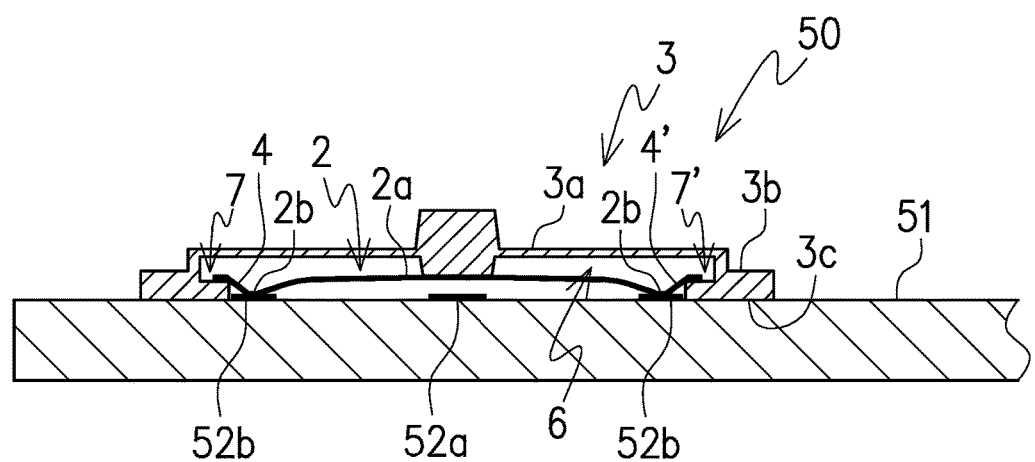
FIG. 6B is a sectional view of the push switch being electrically connected to the motherboard of the electronic device illustrated in FIG. 6A.

A motherboard 51 illustrated in FIG. 6A includes a contact 52. Specifically, the motherboard 51 of the electronic device includes a first electrode as a first contact 52a, and a second electrode as a second contact 52b. FIG. 6A is an exploded perspective view in which a push switch 50 is viewed from above. The push switch 50 includes the switch component 11 for the push switch in accordance with the second embodiment of the present invention. The switch component 11 includes the metallic spring plate 2 and the cover of rubber 3. The metallic spring plate 2 is electrically connected to the motherboard 51. The cover of rubber 3 covers at least one part of the metallic spring plate 2. FIG. 6B is a sectional view of the push switch being electrically connected to the motherboard 51 of the electronic device illustrated in FIG. 6A. The push switch 50 in accordance with this embodiment includes the contact 52, which is arranged on the upper surface of the motherboard 51. The contact 52 includes the first contact 52a and two or more second contacts 52b. The first contact 52a is in the central part. Each second contacts 52b is positioned around the first contact 52a. The metallic spring plate 2 of the switch component 11 is arranged on the second contact 52b over the first contact 52a. At least one part of the outer peripheral edge 2b of the metallic spring plate 2 contacts with the second contact 52b. At the time of pressing the cover of rubber 3, the inverted metallic spring plate 2 contacts with the first contact 52a. In this way, the metallic spring plate 2 is conducted to a connection terminal for circuit (not illustrated). The connection terminal is electrically connected to each of the first contact 52a and the second contact 52b. When the push switch 50 and the motherboard 51 are used as part of the electronic device, such as the smart phones, the wearable devices, etc., the first contact 52a is the first electrode in the electronic device and the second contact 52b is the second electrode.

The central part 3a of the cover of rubber 3 of the push switch 50 covers the whole upper surface 2a of the metallic spring plate 2. The lower surface 3c of the outer peripheral portion 3b of the cover of rubber 3 adheres to the upper surface of the motherboard 51, and covers the outer peripheral edge 2b of the metallic spring plate 2. The metallic spring plate 2 is housed in the sealed hollow portion 6 of the cover of rubber 3, and is supported by the supporting portion of the cover of rubber 3. Since the cover of rubber 3 absorbs the sound with the above configuration, the inverted sound of the metallic spring plate 2 generated at the time of pressing the cover of rubber 3 is eliminated or minimized. The vibration sound generated when the inverted metallic spring plate 2 contacts with the first contact 52a is also eliminated or minimized by the outer peripheral portion 3b of the cover of rubber 3 covering the outer peripheral edge 2b of the metallic spring plate 2.

Figure 7A:
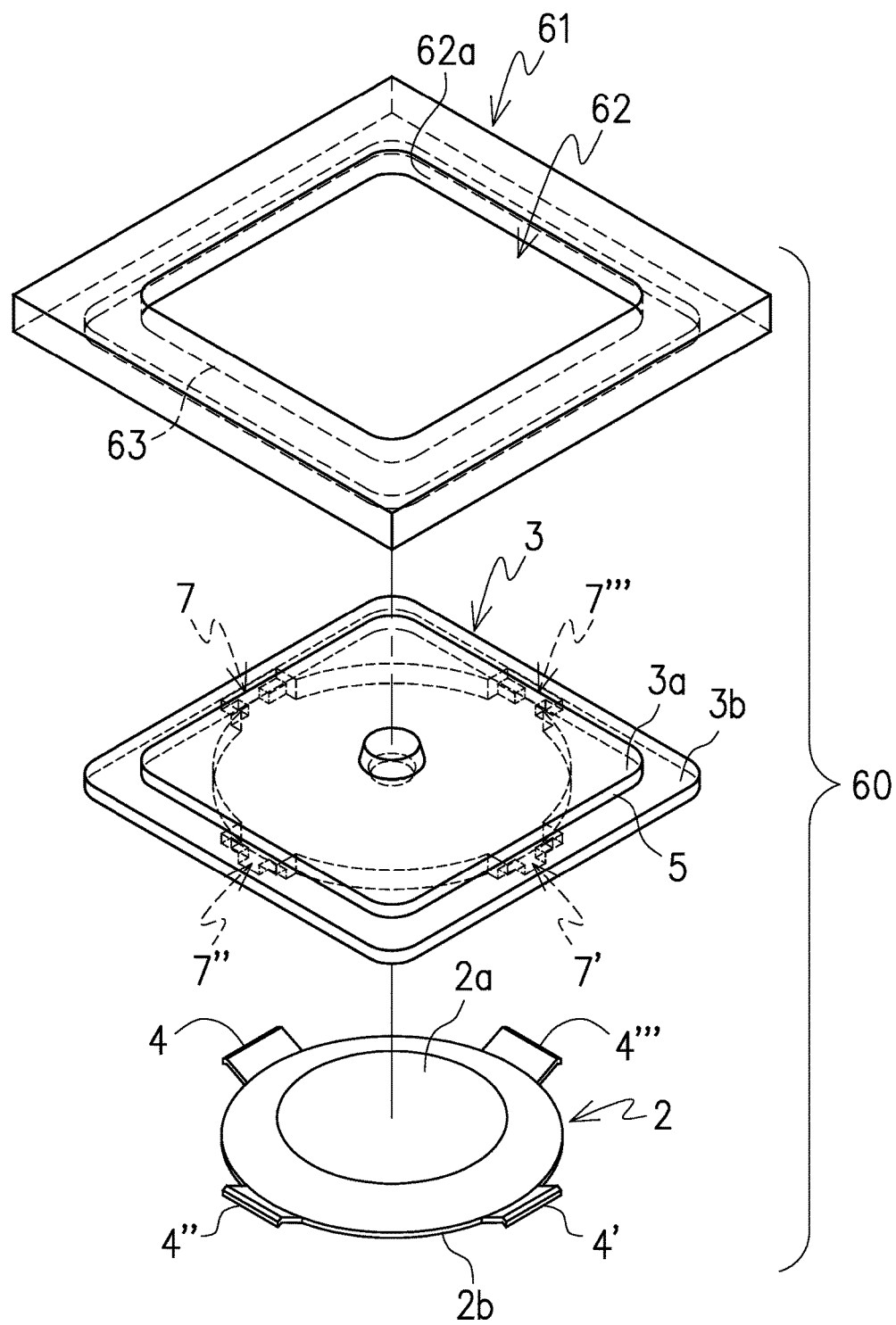
FIG. 7A is an exploded perspective view in which a switch component in accordance with a sixth embodiment of the present invention is viewed from above.
Figure 7B:
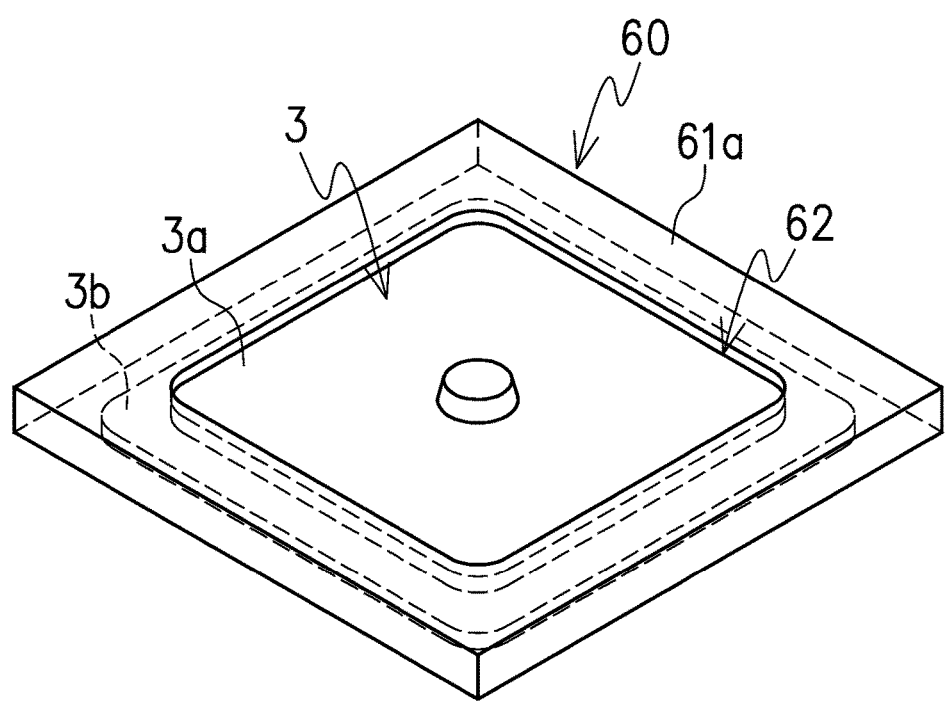
FIG. 7B is an upward perspective view of the switch component in accordance with the sixth embodiment.
Figure 7C:
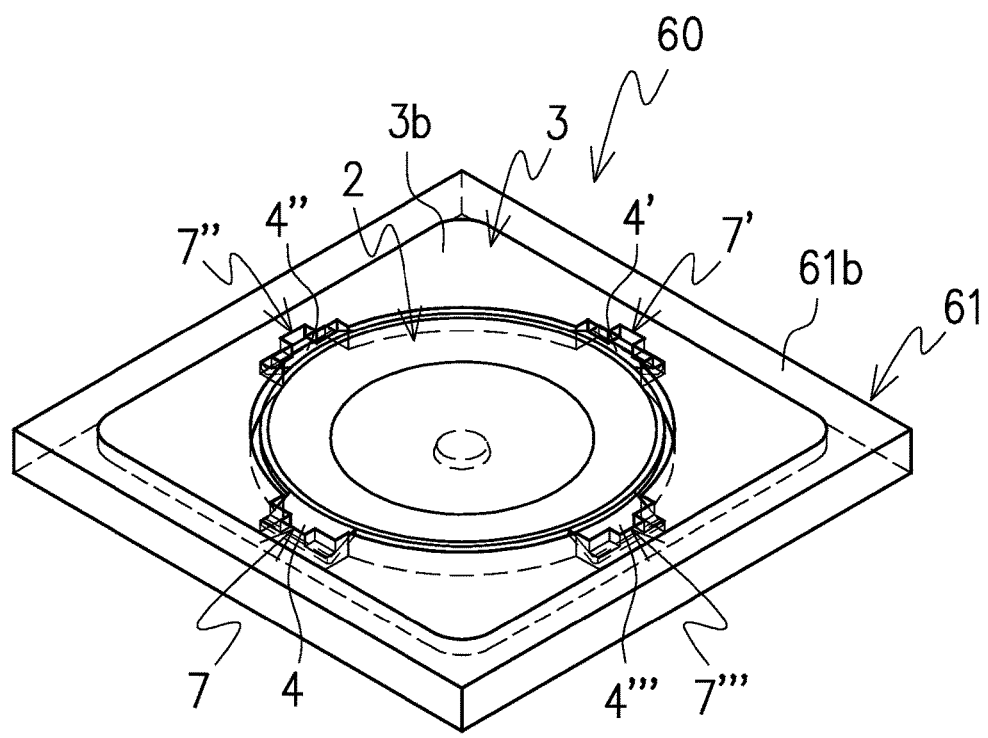
FIG. 7C is a downward perspective view of the switch component in accordance with the sixth embodiment.
Figure 7D:
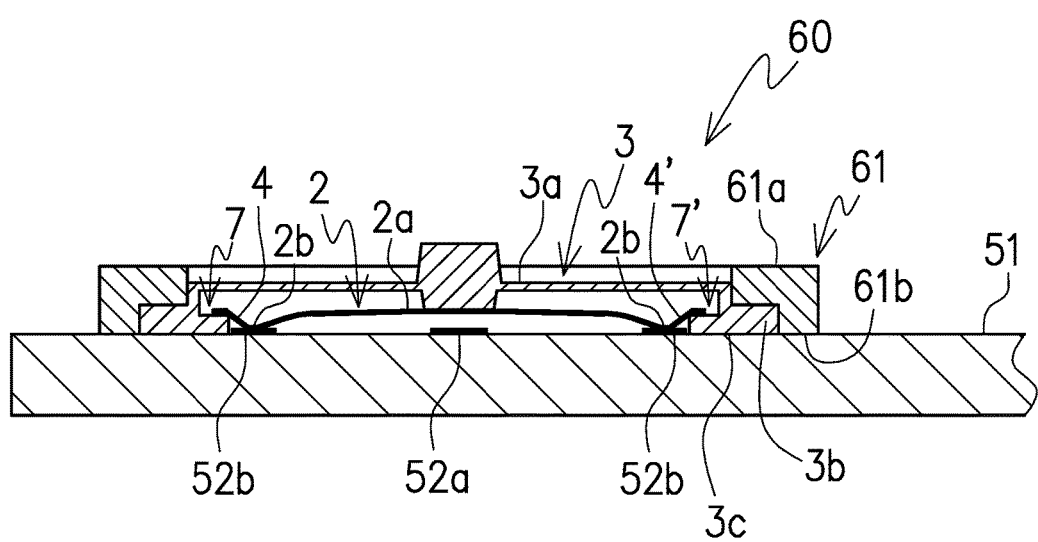
FIG. 7D is a sectional view of a push switch in accordance with a second embodiment, the push switch including a metallic spring plate, a cover of rubber, and a frame, the metallic spring plate being electrically connected to a first electrode as a first contact and a second electrode as a second contact, which are arranged on a motherboard of an electronic device, and the frame being on an upper surface peripheral edge portion of the cover of rubber.

The switch component may also include a frame. FIG. 7A is an exploded perspective view in which a switch component in accordance with a sixth embodiment of the present invention is viewed from above. FIG. 7B is an upward perspective view of the switch component in accordance with the sixth embodiment. FIG. 7C is a downward perspective view of the switch component in accordance with the sixth embodiment. FIG. 7D is a sectional view of a push switch in accordance with a second embodiment. The push switch includes the metallic spring, the cover of rubber, and the frame. The metallic spring is electrically connected to a first electrode as a first contact and a second electrode as a second contact. Each contact is arranged on the motherboard of the electronic device. The frame is on the upper surface peripheral edge portion of the cover of rubber.

A switch component 60 of the sixth embodiment includes the cover of rubber 3, the metallic spring plate 2, and a frame 61. The frame 61 is on the upper surface peripheral edge portion of the cover of rubber 3. The frame 61 has a rectangular opening 62. The outer peripheral edge of the cover of rubber 3 fits into the opening 62. A step portion 63 is formed in an inner peripheral surface 62a of the opening 62. The step portion 63 corresponds to the raised portion 5, which is formed between the central portion 3a and the outer peripheral portion 3b of the cover of rubber 3. When the cover of rubber 3 is attached to the frame 61, the outer peripheral edge of the central portion 3a and the outer peripheral edge of the outer peripheral portion 3b exactly fit into the opening 62. In this embodiment, when the cover of rubber 3 is attached to the frame 61, the upper surface 61a of the frame 61 slightly protrudes above the upper surface of the central portion 3a, and the lower surface 61b of the frame 61 becomes almost the same plane with the lower surface 3c of the outer peripheral portion 3b of the cover of rubber 3. Specifically, if the lower surface 3c of the outer peripheral portion 3b of the cover of rubber 3 contacts with the upper surface of the substrate, it is possible to obtain the sound absorbing effect. Therefore, the lower surface 3c of the outer peripheral portion 3b of the cover of rubber 3 may be the same plane with the lower surface 61b of the frame 61. If the lower surface 3c of the outer peripheral portion 3b of the cover of rubber 3 certainly contacts, even when the lower surface of the frame 61 does not contact with the upper surface of the substrate, it is possible to obtain the sound absorbing effect.

When the push switch is pushed, the central part of the metallic spring plate 2 is inverted at the position near the peripheral edge portion of the metallic spring plate 2, and contacts with the first contact 52a. The metallic spring plate 2 is on the second contact 52b. The first contact 52a and the second contacts 52b are conducted via the metallic spring plate 2.

It is preferable to form the frame 61 with the material harder than the cover of rubber 3. With the above, the cover of rubber 3 is held firmly by the frame 61, and it is possible to press the push switch stably. As illustrated in FIG. 7D, the frame 61 covers the first contact 52a and the second contact 52b, the metallic spring plate 2, and the cover of rubber 3. Each contact is on the upper surface of the motherboard 51. The metallic spring plate 2 is arranged on the contacts. The lower surface 61b of the frame 61 adheres to the upper surface of the motherboard 51. In this way, the vibration sound generated when the metallic spring plate 2 contacts with the first contact 52a is absorbed not only by the cover of rubber 3 but also by the frame 61.

Figure 7E:
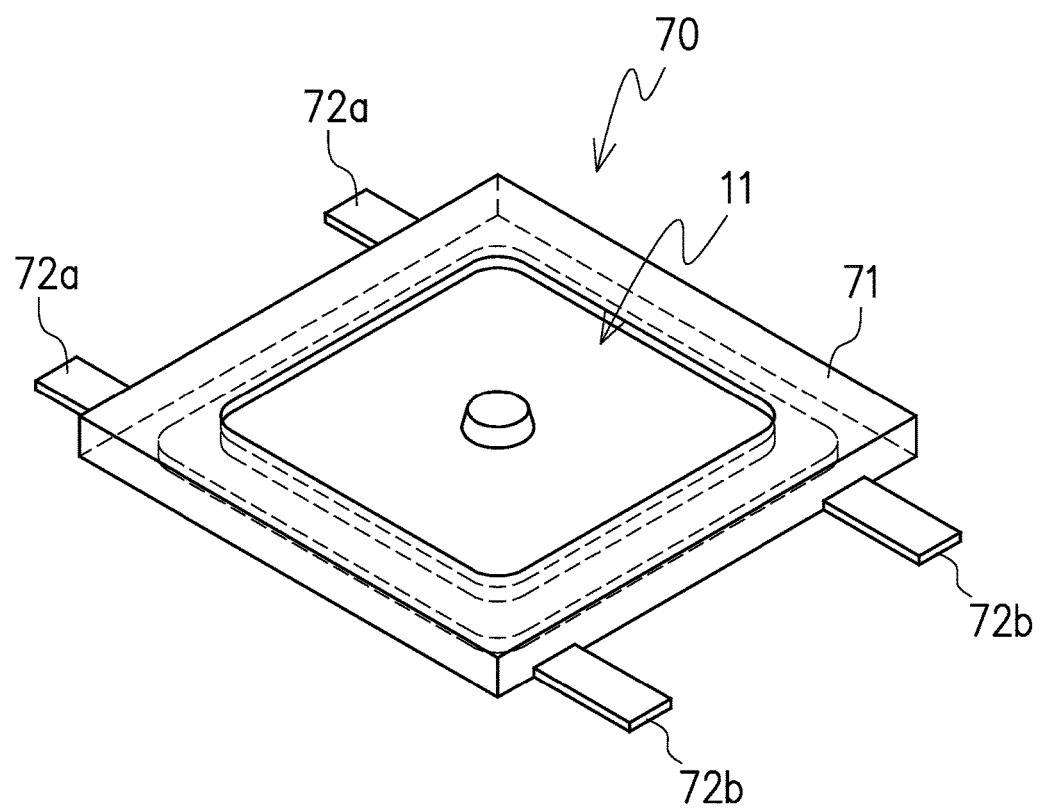
FIG. 7E is an upward perspective view of a switch component in accordance with a seventh embodiment of the present invention.
Figure 7F:
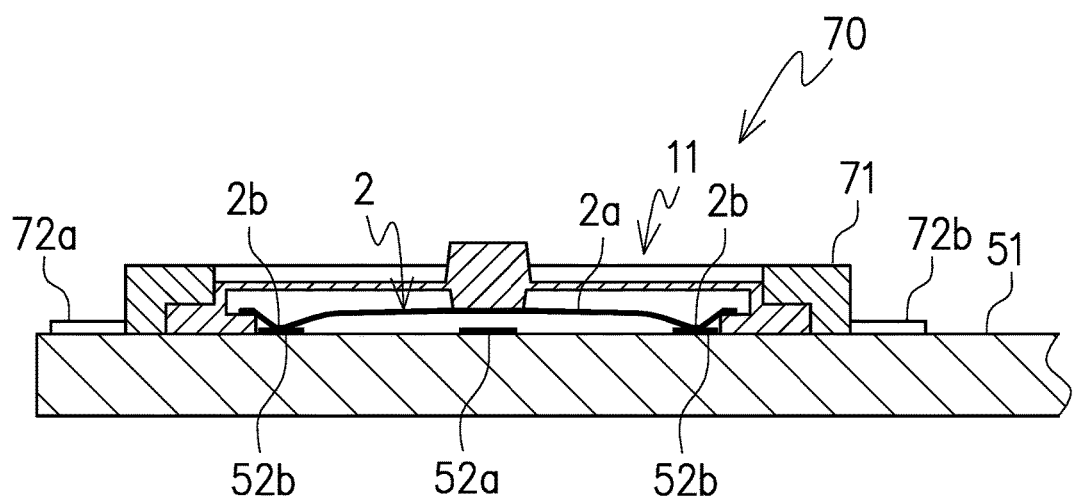
FIG. 7F is a sectional view of a push switch in accordance with a third embodiment, the push switch including a metallic spring plate, a cover of rubber, and a frame, the metallic spring plate being electrically connected to a first electrode as a first contact and a second electrode as a second contact, which are arranged on a motherboard of an electronic device, and the frame being on an upper surface peripheral edge portion of the cover of rubber.

FIG. 7E is an upward perspective view of a switch component in accordance with a seventh embodiment of the present invention. FIG. 7F is a sectional view of a push switch in accordance with a third embodiment, which includes the metallic spring plate, the cover of rubber, and the frame. The metallic spring plate is electrically connected to the first electrode as the first contact and the second electrode as the second contact. Each contact is arranged on the motherboard of the electronic device. The frame is on the upper surface peripheral edge portion of the cover of rubber. A push switch 70 in accordance with this embodiment includes the first contact 52a, the second contact 52b, and the metallic spring plate 2. The first contact 52a is arranged on the motherboard 51. The second contacts 52b are positioned around the first contact 52a. The metallic spring plate 2 is arranged on the second contacts 52b over the first contact 52a. The switch component 11 in accordance with this embodiment includes the doom-shaped metallic spring plate 2, and the cover of rubber 3. The cover of rubber 3 covers at least one part of the upper surface 2a of the metallic spring plate 2, contacts with at least one part of the outer peripheral edge 2b of the surface of the metallic spring plate 2, and covers at least one part of the lower surface in the vicinity of the outer peripheral edge of the metallic spring plate 2. The push switch 70 in accordance with this embodiment also includes a frame 71, which includes at least one pair of connecting terminal electrodes 72a and 72b. The first contact 52a and the second contact 52b of the push switch 70 are electrically connected to at least one pair of connecting terminal electrodes 72a and 72b of the frame 71.

Figure 7G:
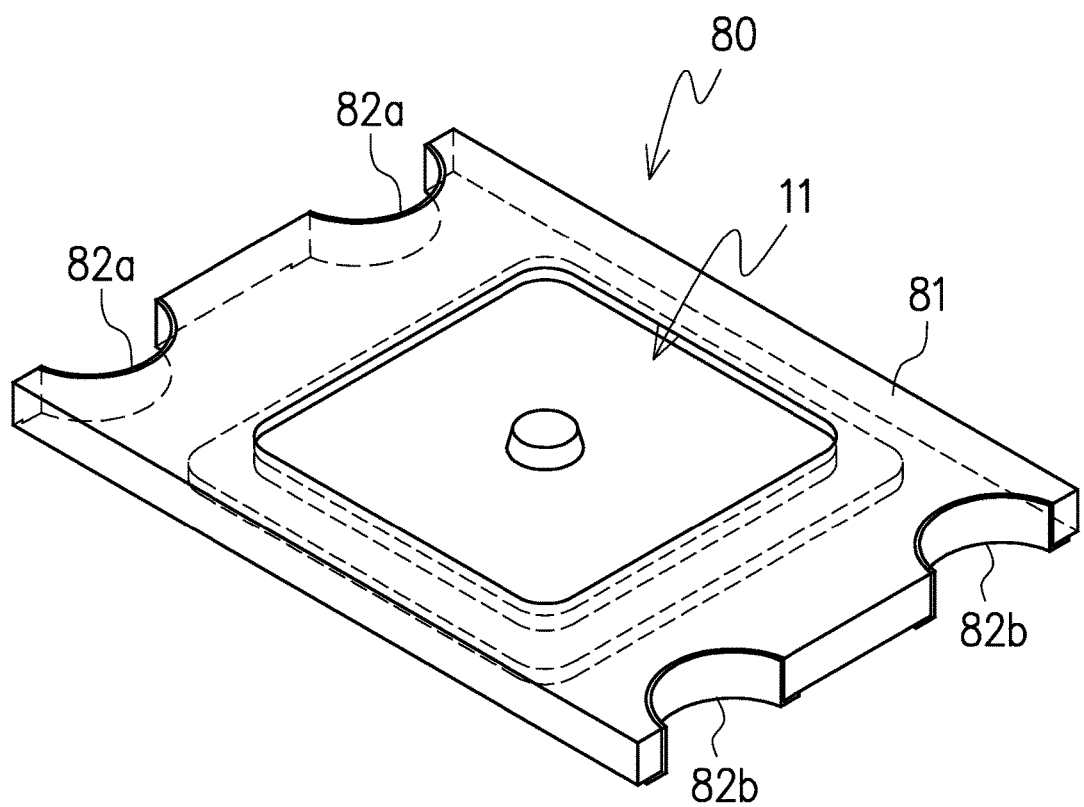
FIG. 7G is an upward perspective view of a switch component in accordance with an eighth embodiment of the present invention.
Figure 7H:
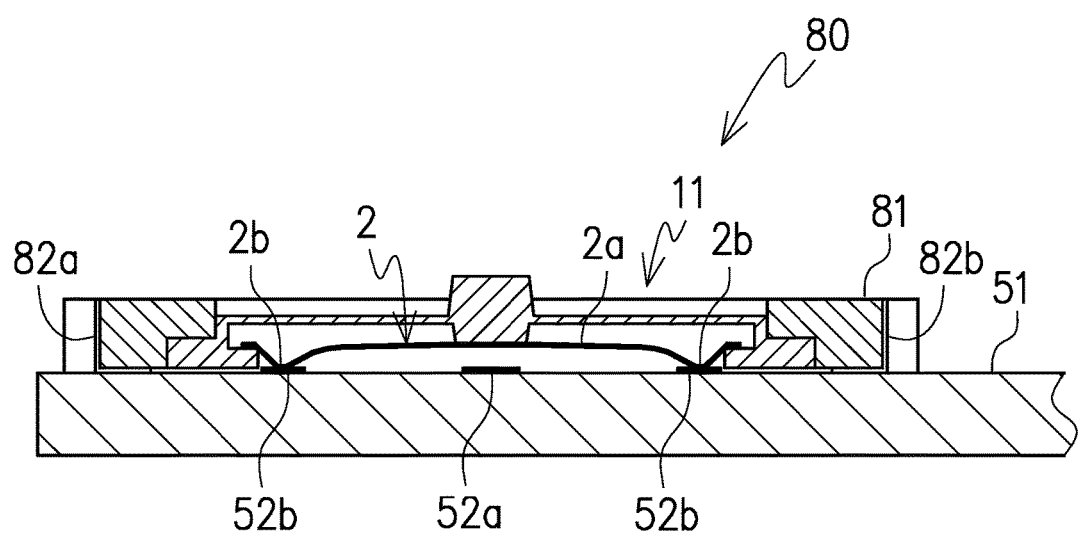
FIG. 7H is a sectional view of a push switch in accordance with a fourth embodiment of the present invention, FIG. 7H illustrating the push switch that includes the switch component in accordance with the eighth embodiment, the switch component including a metallic spring plate, a cover of rubber, and a frame, the metallic spring plate being electrically connected to a first electrode as a first contact and a second electrode as a second contact, which are arranged on a motherboard of an electronic device, and the frame being on an upper surface peripheral portion of the cover of rubber.

FIG. 7G is an upward perspective view of a switch component in accordance with an eighth embodiment of the present invention. FIG. 71H is a sectional view of a push switch in accordance with a fourth embodiment of the present invention, which includes the metallic spring plate, the cover of rubber, and the frame. The metallic spring plate is electrically connected to the first electrode as the first contact and the second electrode as the second contact. Each contact is arranged on the motherboard of the electronic device. The frame is on the upper surface peripheral edge portion of the cover of rubber. A push switch 80 in accordance with this embodiment includes the first contact 52a and the second contacts 52b, and the metallic spring plate 2. The first contact 52a is arranged on the motherboard 51. The second contacts 52b are positioned around the first contact 52a. The metallic spring plate 2 is arranged on the second contacts 52b over the first contact 52a. The switch component 11 in accordance with this embodiment includes the doom-shaped metallic spring plate 2 and the cover of rubber 3. The cover of rubber 3 covers at least one part of the upper surface 2a of the metallic spring plate 2, contacts with at least one part of the outer peripheral edge 2b of the lower surface of the metallic spring plate 2, and covers at least one part of the lower surface in the vicinity of the outer peripheral edge of the metallic spring plate 2. The push switch 80 in accordance with this embodiment also includes a frame 81, which includes at least one pair of through-holes 82a and 82b. The first contact 52a and the second contact 52b of the push switch 80 are electrically connected to at least one pair of through-holes 82a and 82b of the frame 81.

Figure 8A:
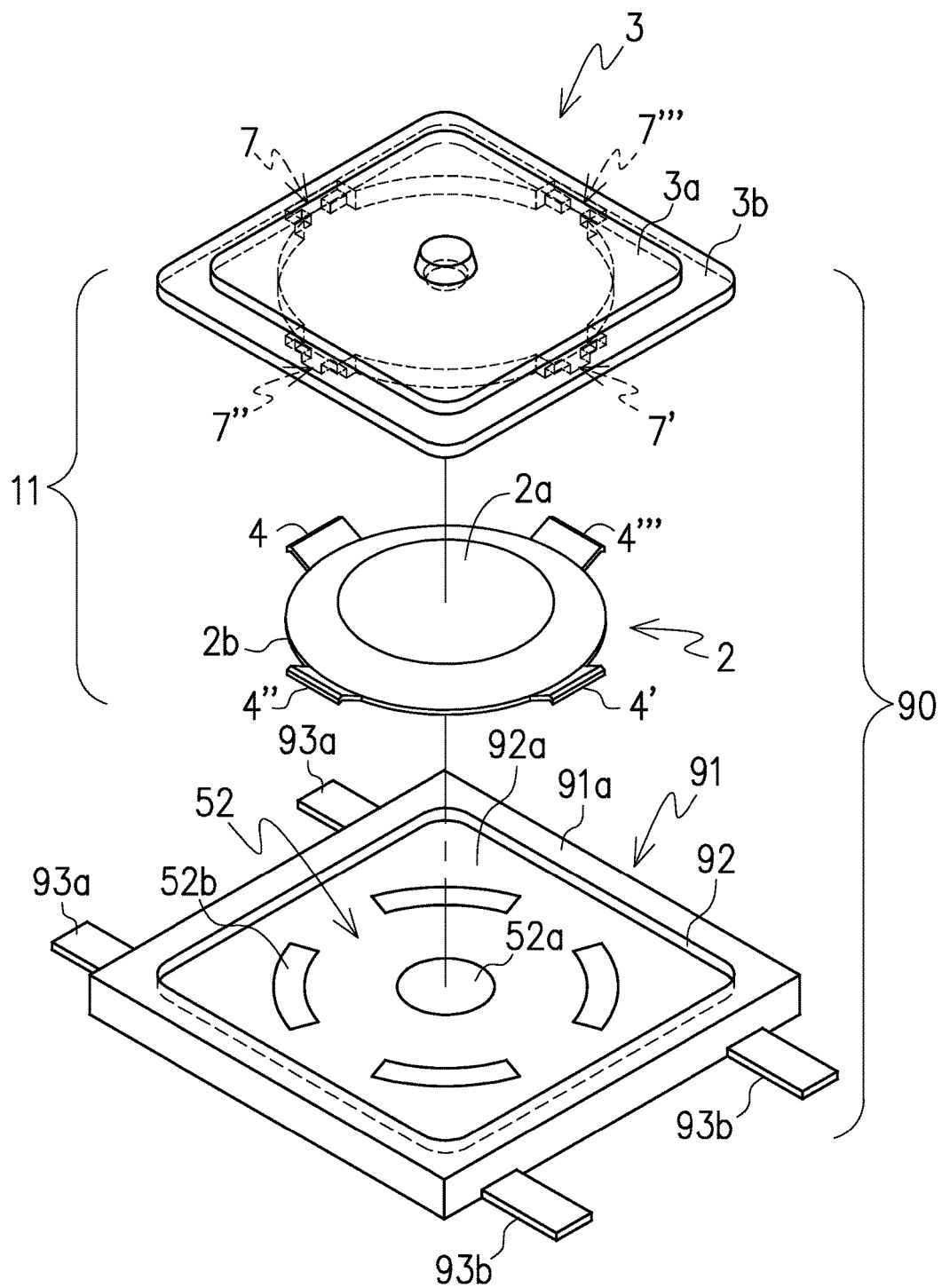
Figure 8B:
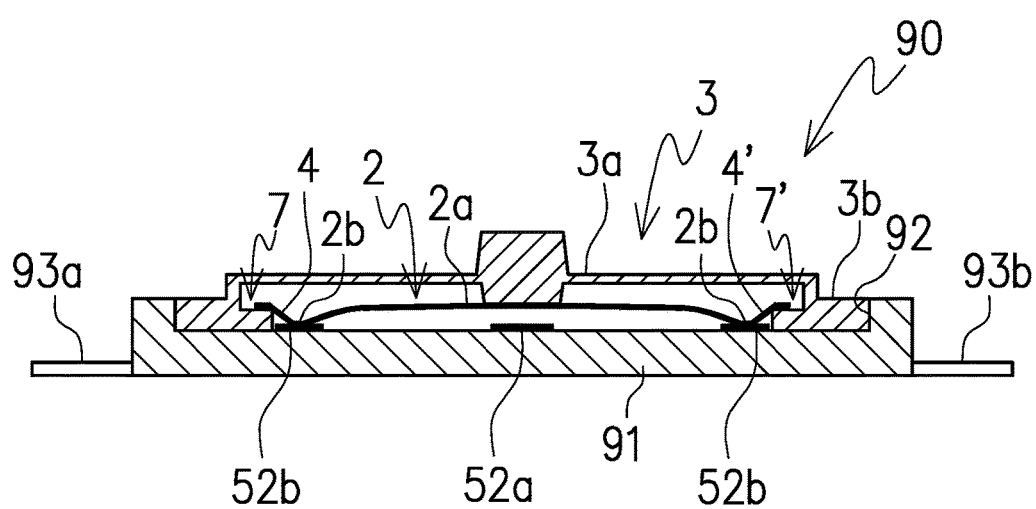
FIG. 8B is a sectional view of the push switch in accordance with the fifth embodiment.

FIG. 8A is an exploded perspective view of a push switch in accordance with a fifth embodiment of the present invention. A push switch 90 includes the first contact 52a and the second contacts 52b. The second contacts 52b are positioned around the first contact 52a. FIG. 8B is a sectional view of the push switch in accordance with the fifth embodiment. A push switch 90 includes a resin body 91 and the switch component 11 in accordance with the second embodiment. The switch component 11 is mounted on the resin body 91. The contact 52 of switch is arranged on the resin body. The resin body 91 includes a rectangular hollow 92. The outer peripheral edge of the cover of rubber 3 of the switch component 11 fits into the hollow 92. The depth of the hollow 92 of the resin body 91 is approximately identical to the thickness of the outer peripheral portion 3b of the cover of rubber 3. When the cover of rubber 3 is fitted into the hollow 92 of the resin body 91, an upper surface 91a surrounding the hollow 92 of the resin body 91 becomes almost the same plane with the upper surface of the outer peripheral portion 3b of the cover of rubber 3. A smooth bottom surface 92a is formed inside the hollow 92 of the resin body 91. The first contact 52a of the push switch 90 is arranged in the center of the bottom surface 92a of the hollow 92. Two or more second contacts 52b is arranged around the first contact 52a. The resin body 91 has one pair of side surfaces. A first connecting metallic lead 93a, which is electrically connected to the first contact 52a, protrudes in a horizontal direction from a first surface of the resin body 91. A second connecting metallic lead 93b, which is electrically connected to the second contact 52b, protrudes in a horizontal direction from a second surface opposite to the first surface of the resin body 91. The switch component 11 according to this embodiment includes the doom-shaped metallic spring plate 2 and the cover of rubber 3. The cover of rubber 3 covers at least one part of the upper surface 2a and at least one part of the outer peripheral edge 2b of the metallic spring plate 2.

The push switch 90 is constituted by fitting the cover of rubber 3 into the hollow 92 of the resin body 91. The metallic spring plate 2 is embedded in the cover of rubber 3 in advance. The push switch according to the embodiment of the present invention is able to electrically implement on the motherboard of the electronic device.

Figure 8C:
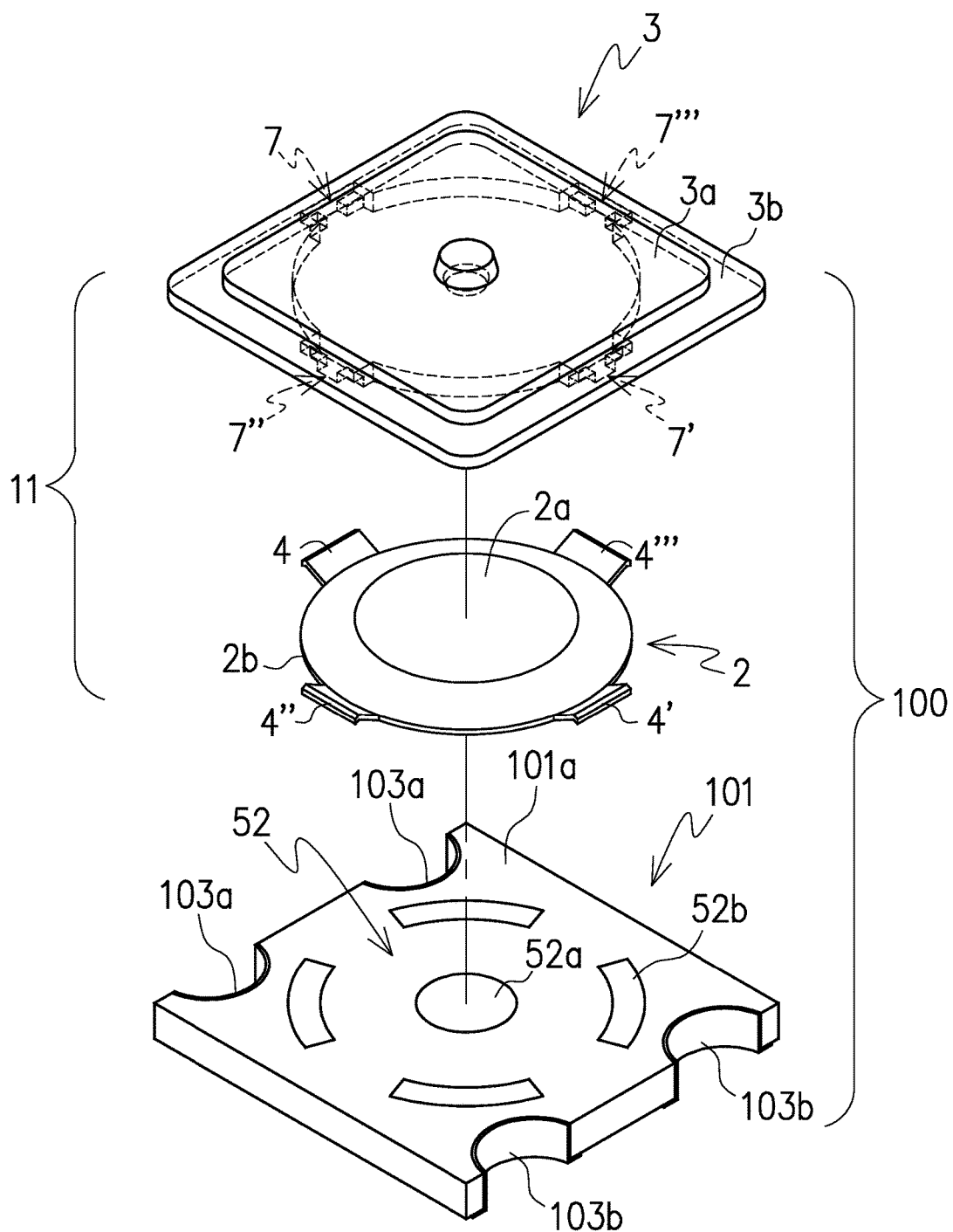
FIG. 8C is an exploded perspective view of a push switch in accordance with a sixth embodiment of the present invention.
Figure 8D:
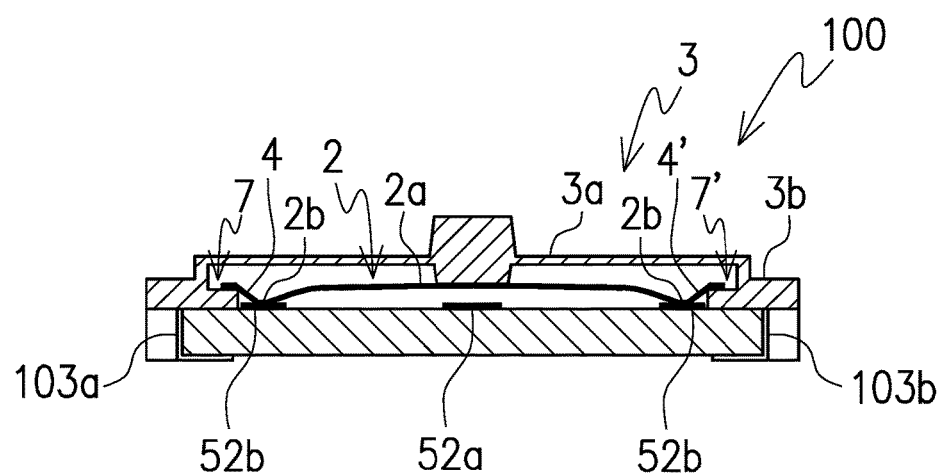
FIG. 8D is a sectional view of the push switch in accordance with the sixth embodiment.

FIG. 8C is an exploded perspective view of a push switch in accordance with a sixth embodiment of the present invention. FIG. 8D is a sectional view of the push switch in accordance with the sixth embodiment. A push switch 100 includes the switch component 11 in accordance with the second embodiment and a substrate 101. The switch component is arranged on the substrate 101. In the push switch 100, the planar shape of the substrate 101 is approximately same size as the cover of rubber 3 of the switch component 11. The substrate 101 has one pair of side surfaces. A first through-hole terminal electrode 103a is arranged on a first side surface of the substrate 101. A second through-hole terminal electrode 103b is arranged on a second side surface opposite to the first surface of the substrate 101. In this way, downsizing is achieved. The through-hole terminal electrode 103a is electrically connected to the first contact 52a. The thorough-hole terminal electrode 103b is electrically connected to the second contact 52b. Each contact is arranged on an upper surface 101a of the substrate 101. The switch component 11 in accordance with this embodiment includes the doom-shaped metallic spring plate 2 and the cover of rubber 3. The cover of rubber 3 covers at least one part of the upper surface 2a of the metallic spring plate 2, contacts with at least one part of the outer peripheral edge 2b of the lower surface of the metallic spring plate 2, and covers at least one part of the lower surface in the vicinity of the outer peripheral edge of the metallic spring plate 2.

As a first consideration, a push switch and/or an electronic device are proposed, which eliminate or minimize vibration sounds generated between a metallic spring plate and a substrate at the time of pushing the push switch. As a second consideration, a switch component and/or a push switch are proposed, which facilitates the positioning of a cover of rubber and a metallic spring plate. As a third consideration, a switch component is proposed, which is applicable for various manufacturing methods for a push switch and/or an electronic device having a push switch.

Obviously, numerous modifications and error of the present invention are possible in light of the above teachings. It is therefore to be understood that within the scope of the appended claims, the present invention may be practiced otherwise than as specifically described herein.

REFERENCE SIGNS LIST 1, 11, 21, 31, 41, 60: a switch component
2, 42: a metallic spring plate
2a, 42a: an upper surface of the metallic spring plate
2b, 42b: an outer peripheral edge of the metallic spring plate
3, 23, 43: a cover of rubber
3a, 43a: a central portion
3b, 43b: an outer peripheral portion
3c: a lower surface of the outer peripheral portion of the cover of rubber
4: a protrusion (a first protrusion)
4': a protrusion (a second protrusion)
4": a protrusion (a third protrusion)
4''': a protrusion (a fourth protrusion)
4a, 4a': a sloping portion of the protrusion
4b, 4b': a hook at an outer end of the sloping portion
5: a raised portion
6, 46: a hollow portion of the cover of rubber
6a: a hollow surface of the hollow portion
6b, 26b, 46b: a peripheral edge of the hollow surface
7, 27, 47: a supporting portion (a first supporting portion)
7', 27', 47': a supporting portion (a second supporting portion)
7", 27": a supporting portion (a third supporting portion)
7''', 27''': a supporting portion (a fourth supporting portion)
7a, 7a', 27a, 27a': a groove
7b, 7b', 27b, 27b', 47b, 47b': a step
8: a protruding portion (a first protruding portion)
8a: a protruding portion (a second protruding portion)
9, 9a: a gap
10: a thickening portion
23a: a first cover
23b: a second cover
26: an opening portion
42c: a first side portion of the metallic spring plate
42c': a second side portion of the metallic spring plate
46c: a first linear portion
46c': a second linear portion
50, 60, 70, 80, 90, 100: a push switch
51: a motherboard
52: contact
52a: a first contact
52b: a second contact
61, 71, 81, a frame
61a: an upper surface of the frame 61b: a lower surface of the frame
62: an opening
62a: an inner peripheral surface of the opening
63: a step portion at the opening
72a, 72b: a connecting terminal electrode
82a, 82b: a through-hole
91: a resin body
91a: an upper surface of the resin body
92: a hollow in the resin body
92a: a bottom surface of the hollow in the sin body
93a: a first connecting metallic lead
93b: a second connecting metallic lead
101: a substrate
101a: an upper surface of the substrate
103a: a first through-hole terminal electrode
103b: a second through-hole terminal electrode

What is claimed is:

1. A switch component comprising:
a metallic spring plate comprising an outer peripheral edge and at least one pair of protrusions protruding from the outer peripheral edge; and
a cover of rubber covering at least one part of an upper surface of the metallic spring plate and comprising at least one pair of supporting portions that support the metallic spring plate,
the at least one pair of supporting portions supporting the at least one pair of protrusions of the metallic spring plate from below.

2. The switch component according to claim 1,
wherein the cover of rubber comprises a first cover covering an upper surface of the metallic spring plate and a second cover covering the outer peripheral edge of the metallic spring plate.

3. The switch component according to claim 2,
wherein the first cover is arranged on the second cover that comprises an opening in which an upper surface of the metallic spring plate is arranged, and
wherein the first cover is in contact with the upper surface of the metallic spring plate in the opening of the second cover.

4. The switch component according to claim 1,
wherein the cover of rubber comprises a hollow portion that covers the upper surface of the metallic spring plate, and the hollow portion comprises a gap between a hollow surface of the hollow portion and the upper surface of the metallic spring plate.

5. The switch component according to claim 4,
wherein the hollow surface of the hollow portion comprises a thickening portion of the cover of rubber that becomes thicker toward a position of the outer peripheral edge of the metallic spring plate.

6. A switch component comprising:
a metallic spring plate comprising an outer peripheral edge and at least one pair of protrusions protruding from the outer peripheral edge; and
a cover of rubber covering at least one part of an upper surface of the metallic spring plate and comprising at least one pair of supporting portions that support the metallic spring plate, and a hollow portion that covers the upper surface of the metallic spring plate,
the at least one pair of supporting portions supporting the at least one pair of protrusions of the metallic spring plate and being positioned between the hollow portion of the cover of rubber and the outer peripheral edge of the cover of rubber.

7. A switch component comprising:
a metallic spring plate comprising an outer peripheral edge and at least one pair of protrusions protruding from the outer peripheral edge; and
a cover of rubber covering at least a part of an upper surface of the metallic spring plate and at least one pair of protrusions protruding from the outer peripheral edge of the metallic spring plate,
the cover of rubber comprising a supporting portion that supports the at least one pair of protrusions of the metallic spring plate, and
the supporting portion of the cover of rubber comprising a groove that supports the at least one pair of protrusions protruding from the outer peripheral edge of the metallic spring plate.

8. A push switch comprising:
the switch component according to claim 7;
a first contact; and
a second contact that is positioned around the first contact,
the metallic spring plate of the switch component being arranged on the second contact over the first contact.

9. The push switch according to claim 8,
wherein the second contact comprises two or more contacts that are positioned around the first contact.

10. The push switch according to claim 8 further comprising:
a resin body comprising a first connecting metallic lead and a second connecting metallic lead,
wherein the first contact is electrically connected to the first connecting metallic lead, and
the second contact is electrically connected to the second connecting metallic lead.

11. The push switch according to claim 8 further comprising:
a substrate comprising an upper surface on that the first contact and the second contact are arranged.

12. The push switch according to claim 11,
wherein the substrate further comprising a first connecting terminal electrode that is electrically connected to the first contact and a second connecting terminal electrode that is electrically connected to the second contact.

13. An electronic device comprising:
a motherboard comprising a first electrode as a first contact and a second electrode as a second contact; and
the switch component of claim 7 being electrically arranged on the motherboard, the outer peripheral edge of the metallic spring plate of the switch component being arranged on the second contact of the motherboard.

14. A push switch comprising:
a first contact;
a second contact being positioned around the first contact;
a metallic spring plate comprising a central portion, an outer peripheral edge, and at least one pair of protrusions protruding from the outer peripheral edge of the metallic spring plate, and the outer peripheral edge of the metallic spring plate being arranged on the second contact and the central portion of the metallic spring plate being positioned over the first contact; and
a cover of rubber covering at least one part of an upper surface of the metallic spring plate and the at least one pair of protrusions protruding from the outer peripheral edge of the metallic spring plate,
the cover of rubber comprising at least one pair of supporting portions that support the at least one pair of protrusions of the metallic spring plate from below.

15. The push switch according to claim 14,
wherein the cover of rubber comprises a first cover covering the upper surface of the metallic spring plate and a second cover supporting the at least one pair of protrusions protruding from the outer peripheral edge of the metallic spring plate.

16. An electronic device comprising:
a motherboard comprising a first electrode and a second electrode; and
a push switch of claim 14 being electrically arranged on the motherboard and the outer peripheral edge of the metallic spring plate being arranged on the second electrode of the motherboard.

* * * * *